(12) United States Patent
Takahashi et al.

(10) Patent No.: US 6,472,693 B1
(45) Date of Patent: Oct. 29, 2002

(54) SEMICONDUCTOR DEVICE AND METHOD OF MANUFACTURING THE SAME

(75) Inventors: Hideki Takahashi, Tokyo (JP); Yoshifumi Tomomatsu, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/696,963

(22) Filed: Oct. 27, 2000

Related U.S. Application Data

(63) Continuation of application No. PCT/JP98/01942, filed on Apr. 27, 1998.

(51) Int. Cl.[7] .............................................. H01L 29/74
(52) U.S. Cl. ...................................... 257/167; 257/107
(58) Field of Search ................................ 257/130, 133, 257/138, 139, 142, 147, 155, 212, 296, 335, 107, 167

(56) References Cited

U.S. PATENT DOCUMENTS

| | | | |
|---|---|---|---|
| 5,227,653 A | * | 7/1993 | Sin |
| 5,621,229 A | * | 4/1997 | Huang |
| 5,751,024 A | | 5/1998 | Takahashi |
| 5,801,408 A | | 9/1998 | Takahashi |
| 5,861,638 A | * | 1/1999 | Oh |
| 5,864,159 A | | 1/1999 | Takahashi |
| 5,981,981 A | | 11/1999 | Takahashi |
| 6,001,678 A | | 12/1999 | Takahashi |
| 6,008,518 A | | 12/1999 | Takahashi |
| 6,040,599 A | | 3/2000 | Takahashi |
| 6,107,650 A | | 8/2000 | Takahashi et al. |
| 6,118,150 A | | 9/2000 | Takahashi |

FOREIGN PATENT DOCUMENTS

| | | |
|---|---|---|
| JP | 60-196974 | 10/1985 |
| JP | 62-101077 | 5/1987 |
| JP | 2-144967 | 6/1990 |
| JP | 4-324684 | 11/1992 |
| JP | 05-160407 | 6/1993 |
| JP | 06-163907 | 6/1994 |
| JP | 6-268208 | 9/1994 |

(List continued on next page.)

OTHER PUBLICATIONS

Mitsuhiko Kitagawa et al, "A 4500 V Injection Enhanced Insulated Gate Bipolar Transistor (IEGT) Operating in a Mode Similar to a Thyristor", IEEE, IEDM, pp. 679–682.
H. Takahashi et al, "Carrier Stored Trench–Gate Bipolar Transistor (CSTBT)—A Novel Power Device for High Voltage Application", 1993, IEEE, pp. 349–352.

*Primary Examiner*—Nathan J. Flynn
*Assistant Examiner*—Kevin Quinto
(74) *Attorney, Agent, or Firm*—Oblon, Spivak, McClelland, Maier & Neustadt, P.C.

(57) ABSTRACT

The present invention relates to a semiconductor device and a method of manufacturing the same, and particularly, an object of the present invention is to reduce an ON voltage while ensuring a wide operating area and sustaining a high breakdown voltage. To achieve this object, a semiconductor base body is divided into a first MOS region and a second MOS region. In the first MOS region, a p base layer, an n$^+$ emitter layer and a p$^+$ layer are provided in an upper main surface of the semiconductor base body. In the second MOS region, a p base layer, an n layer and a p$^+$ layer are provided. When a positive gate voltage is applied to a gate electrode in order to turn on the device, since the p base layer and the emitter electrode are cut off, a main current does not flow in the p base layer. Therefore, a hole accumulation effect is enhanced and the ON voltage is reduced. When a negative gate voltage is applied in order to turn off the device, since a channel region is inverted, the main current constituted of residual carriers flows in both p base layers. Therefore, a wide operating area is ensured. Since no n layer surrounding the p base layer exists, unlike in a CSTBT, there is no problem of degradation in breakdown voltage.

28 Claims, 26 Drawing Sheets

FOREIGN PATENT DOCUMENTS

| | | | |
|---|---|---|---|
| JP | 6-291321 A | * | 10/1994 |
| JP | 6-291321 | | 10/1994 |
| JP | 6-334187 | | 12/1994 |
| JP | 07-302904 | | 11/1995 |
| JP | 07335858 A | * | 12/1995 |
| JP | 9-153611 | | 6/1997 |
| JP | 2-12969 | | 7/1997 |
| JP | 9-186323 | | 7/1997 |

* cited by examiner

FIG. 43

| Wcell | Wcd | Wg | α (p BASE RE-GION RATIO) | V_CE(sat)(250μm) | Vdiode(250μm) | V_CE(sat)(400μm) | Vdiode(400μm) | V_CE(sat)(600μm) | Vdiode(600μm) | Vmos |
|---|---|---|---|---|---|---|---|---|---|---|
| 62  | 18 | 44  | 35.5 | 2.03 | 1.36 | 2.79 | 2.12 | 4.04 | 3.36 | 0.67 |
| 82  | 18 | 64  | 26.8 | 1.97 | 1.20 | 2.63 | 1.85 | 3.73 | 2.94 | 0.78 |
| 102 | 18 | 84  | 21.6 | 1.97 | 1.10 | 2.58 | 1.70 | 3.59 | 2.70 | 0.88 |
| 122 | 18 | 104 | 18.0 | 2.00 | 1.04 | 2.57 | 1.60 | 3.53 | 2.55 | 0.97 |
| 142 | 18 | 124 | 15.5 | 2.04 | 0.99 | 2.59 | 1.53 | 3.51 | 2.43 | 1.06 |
| 162 | 18 | 144 | 13.6 | 2.09 | 0.95 | 2.62 | 1.47 | 3.51 | 2.34 | 1.15 |
| 182 | 18 | 164 | 12.1 | 2.15 | 0.93 | 2.66 | 1.42 | 3.53 | 2.27 | 1.24 |
| 202 | 18 | 184 | 10.9 | 2.21 | 0.91 | 2.71 | 1.38 | 3.57 | 2.22 | 1.33 |
| 222 | 18 | 204 | 9.9  | 2.27 | 0.88 | 2.77 | 1.35 | 3.60 | 2.16 | 1.42 |
| 242 | 18 | 224 | 9.1  | 2.34 | 0.86 | 2.82 | 1.32 | 3.65 | 2.13 | 1.50 |
| 262 | 18 | 244 | 8.4  | 2.41 | 0.85 | 2.89 | 1.30 | 3.71 | 2.09 | 1.59 |

US 6,472,693 B1

SEMICONDUCTOR DEVICE AND METHOD OF MANUFACTURING THE SAME

This application is a Continuation of International application Ser. No. PCT/JP98/01942 Filed on Apr. 27, 1998

TECHNICAL FIELD

The present invention relates to a semiconductor device and a method of manufacturing the same, and more particularly to an improvement to reduce an ON voltage while sustaining a high breakdown voltage and ensuring a wide operating area.

BACKGROUND ART

FIG. 41 is a cross-sectional elevation of a conventional insulated gate bipolar transistor (hereinafter, referred to as "IGBT") in the background art of the present invention. In this device 150, as is in general in a power semiconductor device, a lot of unit cells UC connected in parallel are incorporated in a single semiconductor base body 93 in order to gain a large main current. The unit cells UC are minimum units constituting the device 150 and each has an IGBT structure, serving as an IGBT. FIG. 41 shows one unit cell UC.

The device 150 has a structure of so-called "vertical-type" and "planar-type" IGBT. The "vertical-type" one has a structure in which a pair of main electrodes are connected to one and the other of two main surfaces of a semiconductor base body 93 and the "planar-type" one has a structure in which a gate electrode is opposed in parallel to one of the main surfaces of the semiconductor base body 93. In the device 150, the semiconductor base body 93 whose base material is a silicon comprises a p collector layer 81 and an n layer 82. The n layer 82 comprises an n$^+$ buffer layer 95 having a junction between the p collector layer 81 and itself and an n$^+$ layer 83 exposed to an upper main surface of the semiconductor base body 93. The p collector layer 81 is exposed to a lower main surface of the semiconductor base body 93.

A p base layer 84 is selectively formed in a surface to which the n$^-$ layer 83 is exposed, and an n$^+$ emitter layer 85 is selectively formed in a surface to which the p base layer 84 is exposed. The n$^+$ emitter layer 85 is formed to be shallower than the p base layer 84 and inside the p base layer 84. Further, the n$^+$ emitter layer 85 is divided into two regions in a single p base layer 84. Therefore, a first region of the p base layer 84 sandwiched by the two divided regions of the n$^+$ emitter layer 85 and two second regions of the p base layer 84 sandwiched by the two divided regions and the n$^-$ layer 83, respectively, are selectively exposed in the upper main surface of the semiconductor base body 93.

An emitter electrode 89 is connected to the first region to which the p base layer 84 is exposed and part of a surface to which the n$^+$ emitter layer 85 is exposed in the upper main surface of the semiconductor base body 93. Further, a gate insulating film 87 and a gate electrode 88 are formed on the second region of the p base layer 84. Specifically, the gate electrode 88 is opposed to the second region of the p base layer 84 with the gate insulating film 87 sandwiched therebetween. As a result, the second region serves as a channel region CH. A collector electrode 94 is connected to the lower main surface of the semiconductor base body 93, i.e., the surface to which the p collector layer 81 is exposed. The emitter electrode 89 and the collector electrode 94 serve as a pair of main electrodes.

When the device 150 is used, a power supply is connected (usually through a load) between the emitter electrode 89 and the collector electrode 94. A collector voltage is thereby applied between the collector electrode 94 and the emitter electrode 89 so that a potential at the collector electrode 94 may become positive with the emitter electrode 89 as a reference. In this state, by controlling a voltage applied to the gate electrode 88, i.e., a gate voltage with the emitter electrode 89 as a reference, the magnitude of a main current (collector current) flowing from the collector electrode 94 to the emitter electrode 89 can be controlled.

When a positive gate voltage higher than a gate threshold voltage inherent to the device 150 is applied, the channel region CH positioned immediately below the gate electrode 88 is inverted from natural p type to n type. Specifically, an n-type inversion layer is formed in the channel region CH. As a result, electrons flowing from the emitter electrode 89 through the n$^+$ emitter layer 85 is injected into the n$^-$ layer 83 through the channel region CH.

Since a portion between the p collector layer 81 and the n layer 82 (including the n$^-$ layer 83 and the n$^+$ buffer layer 95) is biased in the forward direction by the implanted electrons, holes are injected from the p collector layer 81 into the n$^-$ layer 83. That causes modulation of conductivity to largely reduce the resistance of the n$^-$ layer 83, and therefore a large main current flows from the collector electrode 94 to the emitter electrode 89. In other words, the device 150 is brought into conduction (an ON state).

Next, when the gate voltage is returned to zero or negative value, the channel region CH is returned to the natural p type. As a result, since the injection of the electrons from the emitter electrode 89 is stopped, the injection of the hole from the p collector layer 81 is also stopped. After that, the holes accumulated in the n$^-$ layer 83 (and the n$^+$ buffer layer 95) are retrieved in the emitter electrode 89 and then extinguished. In other words, the device 150 is brought into a cut-off state (an OFF state).

Thus, the device 150 having the IGBT structure has an advantage that the collector voltage in the ON state, i.e., the ON voltage is low because the modulation of conductivity is used. In the IGBT, generally, the ON voltage $V_{CE}$ (SAT) is expressed by Eq. 1.

$$V_{CE}(\text{sat}) = V_{MOS} + V_{DIODE} \qquad \text{(Eq. 1)}$$

where $V_{MOS}$ represents a voltage drop (ON voltage of a MOSFET) developed in a MOSFET equivalently constituted of the n$^+$ emitter layer 85, the channel region CH and the n$^-$ layer 83 and $V_{DIODE}$ represents a voltage drop (ON voltage of a diode) developed in a diode equivalently constituted of the p collector layer 81 and the n layer 82. As shown in Eq. 1, the ON voltage $V_{CE}$(sat) can be divided into two components.

Further, when the IGBT is in the ON state, the resistance R of the n$^-$ layer 83 which causes the modulation of conductivity is expressed by Eq. 2.

$$R \approx W2/(2 \cdot \sqrt{(D \cdot \tau^2)}) \qquad \text{(Eq. 2)}$$

where W represents the thickness of the n$^-$ layer 83, D represents a diffusion coefficient of the hole and τ represents the lifetime of the hole in the n$^-$ layer 83. As shown in Eq. 2, the resistance R of the n$^-$ layer 83 depends on the thickness W of the n$^-$ layer 83 and the lifetime τ.

In order to achieve an IGBT of high breakdown voltage, it is necessary to set the thickness D of the n$^-$ layer 83 larger. For this reason, in the IGBT of high breakdown voltage, the ratio of the voltage drop $V_{DIODE}$ developed in the diode among the two components constituting the ON voltage $V_{CE}(\text{sat})$ is high. In other words, in the IGBT of high breakdown voltage, reducing the ON voltage of the diode is more effective in reducing the ON voltage $V_{CE}(\text{sat})$ than reducing the ON voltage of the MOSFET.

In this direction, as a semiconductor device with reduced On voltage $V_{CE}(\text{sat})$, Kitagawa et al. proposes Injection Enhanced Transistor (IEGT) ("IEDM" (1993) pp. 679 to 682) and Takahashi et al. proposes Carrier Stored Trench-Gate bipolar Transistor (CSTBT) ("ISPSD" (1996) pp. 349 to 352). In the IEGT, part of a p base layer is not short circuited with an emitter electrode. That allows accumulation of a hole current injected from a p collector layer in an emitter region. As a result, since the carrier concentration near an emitter layer is increased and the modulation of conductivity is accelerated, the ON voltage $V_{DIODE}$ of a diode is improvingly lowered.

Further, in the CSTBT, an n+ layer of relatively high impurity concentration is formed immediately below a p base layer. That allows accumulation of a hole current implanted from a p collector layer in an emitter layer, like in the IEGT. As a result, since the carrier concentration near the emitter layer is increased and the modulation of conductivity is accelerated, the ON voltage $V_{DIODE}$ of a diode is improvingly lowered.

The above two types of devices are reported as semiconductor devices each having a gate electrode buried in a trench formed in an upper main surface of a semiconductor base body (i.e., trench gate), i.e., "trench-type" devices. Also in the semiconductor device having the gate electrode 88 opposed to the upper main surface of the semiconductor base body 93, i.e., the "planar-type" device, like the device 150 (FIG. 41), however, the same effect is expected. A "planar-type" IEGT can be achieved by reducing the ratio of a region in which the MOSFET is formed (hereinafter, referred to as "MOSFET region") in the main surface of the semiconductor base body and restricting a path through which the hole current flows to the emitter electrode 89 to be narrow.

In order to confirm this, we calculate the three kinds of On voltages $V_{CE}(\text{sat})$, $V_{DIODE}$ and $V_{MOS}$ by using simulation in a case where the ratio of the MOSFET region varies in the "planar-type" IGBT shown in FIG. 41. Concurrently, in the simulation, the effect produced when the thickness of the n− layer 83 varies is also checked. The obtained result is shown in the graph and table of FIGS. 42 and 43, respectively.

In order to change the ratio of the MOSFET region, the width Wcell of the unit cell UC (cell width) is varied while the width Wcd of an opening (opening width) of the gate electrode 88 is kept constant. In other words, a variety of ratios of the MOSFET region can be obtained by varying the cell width Wcell while keeping the width Wp of the p base layer 84 (base width) constant. In the first to third columns of FIG. 43, the numerical values of the cell width Wcell, the opening width Wcd, and the width Wg of the gate electrode (Wg=Wcell−Wcd) are shown in μm.

Further, the MOSFET region ratio α shown in FIGS. 42 and 43 is defined by the p base region ratio expressed by Eq. 3.

$$\alpha = Wp/\text{Wcell} \qquad (\text{Eq. 3})$$

Furthermore, the numeral values, e.g., "(250 μm)" applied to the ON voltages $V_{CD}(\text{sat})$ and $V_{DIODE}$ indicate the thickness of the n− layer 83 (the depth of an interface between the n− layer 83 and the n+ buffer layer 95 with the upper main surface of the semiconductor base body 93 as a reference). The numeral values of the On voltages $V_{CE}(\text{sat})$, $V_{DIODE}$ and $V_{MOS}$ in FIG. 43 are shown in volt (V).

First, FIG. 42 makes it clear that the On voltage $V_{MOS}$ of the MOSFET becomes higher while the ON voltage $V_{DIODE}$ of the diode becomes lower as the MOSFET region ratio α decreases. Secondly, it is clearly shown that the ratio of the On voltage $V_{DIODE}$ of the diode in the ON voltage $V_{CE}(\text{sat})$ of the IGBT becomes higher as the thickness of the n− layer 83 increases. In other words, the result of the simulation supports that reducing the MOSFET region ratio a effectively contributes to reduction in the ON voltage $V_{CE}(\text{sat})$ of the IGBT in the device of high breakdown voltage in which the n− layer 83 is set thick.

In the "planar-type" device, however, there are some problems in achieving both high breakdown voltage and low ON voltage. One of the problems is that since reducing the MOSFET region ratio α is equivalent to reduction in the ratio of the p base layer 84, the density of the hole current flowing in the p base layer 84 becomes higher when the device is turned off (shifted from the ON state to the OFF state). When the density of the hole current flowing in the p base layer 84 becomes higher at the turning-off, for example, an operating area evaluated by the SOA becomes narrower.

On the other hand, in order to achieve a "planar-type" CSTBT, it is only necessary to form an n+ layer immediately below the p base layer 84 and not necessary to reduce the MOSFET region ratio α, and therefore the problem of narrower operating area can be avoided. In such a structure, however, since the strength of an electric field caused by application of reverse voltage, there arises another problem of degradation of the breakdown voltage. Further, it is said that the cause of operation failure due to cosmic ray is closely related to the electric field strength, and there is possibility of an increase of failure incidence.

Thus, in the "planar-type" semiconductor device in the background art, it is disadvantageously difficult to ensure reduction in the ON voltage while sustaining a high breakdown voltage and ensuring a wide operating area.

DISCLOSURE INVENTION

The present invention is intended to solve the above problems and an object of the present invention is to provide a semiconductor device which can reduce an ON voltage while sustaining a high breakdown voltage and ensuring a wide operating area. Further, another object of the present invention is to provide a method suitable for manufacturing such a semiconductor device.

According to a first aspect of a semiconductor device of the present invention, the semiconductor device comprises a semiconductor base body defining an upper main surface and a lower main surface, and the semiconductor base body comprises a first semiconductor layer of a first conductivity type exposed to the lower main surface; a second semiconductor layer of a second conductivity type formed on the first semiconductor layer and exposed to the upper main surface; a third semiconductor layer of the first conductivity type selectively formed in the upper main surface, being shallower than the second semiconductor layer; a fourth semiconductor layer of the second conductivity type selectively formed in a surface to which the third semiconductor layer is exposed, being shallower than the third semiconductor layer and inside the third semiconductor layer; a fifth semiconductor layer of the first conductivity type selectively formed in the upper main surface, being shallower than the second semiconductor layer and away from the third semiconductor layer; a sixth semiconductor layer of the second conductivity type selectively formed in a surface to which the fifth semiconductor layer is exposed, being shallower than the fifth semiconductor layer and inside the fifth semiconductor layer; and a seventh semiconductor layer of the first conductivity type selectively formed in a surface to which the sixth semiconductor layer is exposed, being shallower than the sixth semiconductor layer and inside the sixth semiconductor layer.

Moreover, a surface to which the third semiconductor layer is exposed in the upper surface includes a first region and a second region separated by the fourth semiconductor layer, and at least the second region of them is sandwiched by a surface to which the fourth semiconductor layer is exposed and a surface to which the second semiconductor layer is exposed, and the device further comprises: a first gate electrode opposed to the second region with a first insulating film sandwiched therebetween; a second gate electrode opposed to a surface to which the sixth semiconductor layer is exposed in said upper surface with a second insulating film sandwiched therebetween; a first main electrode connected to the first region, the fourth semiconductor layer and the seventh semiconductor layer; and a second main electrode connected to the lower main surface.

According to a second aspect of the semiconductor device of the present invention, in the first aspect, the first gate electrode and the second gate electrode are electrically connected to each other.

According to a third aspect of the semiconductor device of the present invention, in the second aspect, the first insulating film and the second insulating film are contiguously coupled to form a single insulating film, and the first gate electrode and the second gate electrode are contiguously coupled to form a single gate electrode, and a surface to which the second semiconductor layer is exposed with the same sandwiched between the third semiconductor layer and the seventh semiconductor layer in the upper main surface is covered with the single gate electrode with the single insulating film sandwiched therebetween.

According to a fourth aspect of the semiconductor device of the present invention, in the second aspect, an area of the first gate electrode covering the upper main surface is larger that of the second gate electrode covering the upper main surface, and the first gate electrode and the second gate electrode are connected to each other at an end portion along the upper main surface.

According to a fifth aspect of the semiconductor device of the present invention, in the first aspect, the first gate electrode and the second gate electrode are electrically insulated from each other.

According to a sixth aspect of the semiconductor device of the present invention, in the first aspect, the semiconductor base body further comprises an eighth semiconductor layer of the first conductivity type formed in the surface to which the sixth semiconductor layer is exposed in the upper main surface.

According to a seventh aspect of the semiconductor device of the present invention, in the first aspect, the semiconductor base body further comprises an eighth semiconductor layer of the first conductivity type selectively formed in an exposed surface which is a surface to which the second semiconductor layer is exposed in the upper main surface, being shallower than the second semiconductor layer and away from both the third and fifth semiconductor layers.

According to an eighth aspect of the semiconductor device of the present invention, in the seventh aspect, the first insulating film and the first gate electrode are so extended as to also cover a portion adjacent to the third semiconductor layer in the exposed surface, and the second insulating film and the second gate electrode are so extended as to also cover a portion adjacent to the fifth semiconductor layer in the exposed surface, and a surface portion covered with neither the first gate electrode nor the second gate electrode exists in the exposed surface, and the eighth semiconductor layer is selectively formed in a region including the surface portion in the exposed surface.

According to a ninth aspect of the semiconductor device of the present invention, in the eighth aspect, the third semiconductor layer, the fifth semiconductor layer and the eighth semiconductor layer are identical in depth and impurity concentration with one another.

According to a tenth aspect of the semiconductor device of the present invention, in the first aspect, a multilayer structure including the fifth, sixth and seventh semiconductor layers is divided into a plurality of unit multilayer structures formed away from one another, the second insulating film and the second gate electrode comprise a plurality of unit second insulating films and a plurality of unit second gate electrodes, respectively, any one of the plurality of unit second gate electrodes is opposed to a surface to which a portion of the sixth semiconductor layer included in corresponding one of the plurality of unit multilayer structures is exposed in the upper main surface with corresponding one of the plurality of unit second insulating films sandwiched therebetween, and the first main electrode is connected to a portion of the seventh semiconductor layer included in each of the plurality of unit multilayer structures.

According to an eleventh aspect of the semiconductor device of the present invention, in the first aspect, a multilayer structure including the fifth, sixth and seventh semiconductor layers is so annularly formed as to surround the third semiconductor layer.

According to a twelfth aspect of the semiconductor device of the present invention, in the first aspect, the semiconductor base body further comprises an eighth semiconductor layer of the second conductivity type having an impurity concentration higher than that of the third semiconductor layer, selectively formed in a region inside edges of the third semiconductor layer in the upper main surface, being exposed to the first region and not exposed to the second region, and the first main electrode is connected to the third semiconductor layer through the eighth semiconductor layer.

According to a thirteenth aspect of the semiconductor device of the present invention, in the twelfth aspect, the seventh semiconductor layer and the eighth semiconductor layer are identical in depth and impurity concentration with each other.

According to a fourteenth aspect of the semiconductor device of the present invention, in the first aspect, the third semiconductor layer and the fifth semiconductor layer are identical in depth and impurity concentration with each other.

According to a first aspect of a manufacturing method of the present invention, the method of manufacturing a semiconductor device comprises the steps of: (a) preparing a semiconductor base body defining an upper main surface and a lower main surface and comprising a first semiconductor layer of a first conductivity type exposed to the lower main surface and a second semiconductor layer of a second conductivity type formed on the first semiconductor layer and exposed to the upper main surface; (b) selectively introducing an impurity of the first conductivity type into the upper main surface to selectively form a third semiconductor layer of the first conductivity type to be shallower than the second semiconductor layer in the upper main surface; (c)

selectively introducing the impurity of the first conductivity type into the upper main surface to selectively form a fifth semiconductor layer of the first conductivity type to be shallower than the second semiconductor layer and away from the third semiconductor layer in the upper main surface; and (d) selectively introducing an impurity of the second conductivity type into the upper main surface to selectively form a fourth semiconductor layer of the second conductivity type to be shallower than the third semiconductor layer and inside the third semiconductor layer in a surface to which the third semiconductor layer is exposed.

Moreover, the fourth semiconductor layer is formed in the step (d) so that a surface to which the third semiconductor layer is exposed in the upper surface includes a first region and a second region separated by the fourth semiconductor layer and at least the second region of them is sandwiched by a surface to which the fourth semiconductor layer is exposed and a surface to which the second semiconductor layer is exposed, and the manufacturing method further comprises the steps of: (e) selectively introducing the impurity of the second conductivity type into the upper main surface to selectively form a sixth semiconductor layer of the second conductivity type to be shallower than the fifth semiconductor layer and inside the fifth semiconductor layer in a surface to which the fifth semiconductor layer is exposed, (f) selectively introducing the impurity of the first conductivity type into the upper main surface to selectively form a seventh semiconductor layer of the first conductivity type to be shallower than the sixth semiconductor layer and inside the sixth semiconductor layer in a surface to which the sixth semiconductor layer is exposed; (g) selectively forming a first insulating film and a second insulating film in the upper main surface; (h) forming a first gate electrode and a second gate electrode on the first insulating film and the second insulating film, respectively; (i) connecting a first main electrode to the first region, the fourth semiconductor layer and the seventh semiconductor layer; and (j) connecting a second main electrode to the lower main surface.

Moreover, the steps (b) to (h) are performed so that the first gate electrode is opposed to the second region and the second gate electrode is opposed to a surface in which the sixth semiconductor layer is exposed in the upper main surface.

According to a second aspect of the manufacturing method of the present invention, in the first aspect, the steps (g) and (h) are performed before the steps (b) and (c), and the impurity of the first conductivity type is selectively implanted in the upper main surface with the first gate electrode and the second gate electrode used as shields and thereafter diffused to form the third semiconductor layer and the fifth semiconductor layer at the same time in the steps (b) and (c).

According to a third aspect of the manufacturing method of the present invention, in the second aspect, the first insulating film and the second insulating film are so formed as to be contiguously coupled to form a single insulating film in the step (g), and the first gate electrode and the second gate electrode are so formed as to be contiguously coupled to form a single gate electrode in the step (h).

According to a fourth aspect of the manufacturing method of the present invention, in the second aspect, the impurity of the first conductivity type is selectively implanted in the upper main surface with the first gate electrode and the second gate electrode used as shields and thereafter diffused to form the third semiconductor layer and the fifth semiconductor layer and selectively form an eighth semiconductor layer of the first conductivity type at the same time in the upper surface to be shallower than the second semiconductor layer and away from both the third semiconductor layer and the fifth semiconductor layer in the steps (b) and (c).

According to a fifth aspect of the manufacturing method of the present invention, in the first aspect, the step (f) comprises the steps of (f-1) selectively forming a shield over the upper main surface; and (f-2) selectively implanting the impurity of the first conductivity type in the upper main surface by using the shield and thereafter diffusing it to form the seventh semiconductor layer and form an eighth semiconductor layer of the first conductivity type having an impurity concentration higher than that of the third semiconductor layer in a region inside edges of the third semiconductor layer in the upper main surface to be exposed to the first region and not to be exposed to the second region.

In the semiconductor device of the first aspect of the present invention, a first channel region is formed in the second region of the third semiconductor layer opposed to the first gate electrode and a second channel region having the conductivity type opposite to that of the first channel region is formed in the exposed surface of the sixth semiconductor layer opposed to the second gate electrode. When a predetermined gate voltage is applied to the first and second gate electrodes so that an inversion layer may be formed in the first channel, the device is brought into conduction. At this time, a main current mainly constituted of the carriers generated in the first semiconductor layer, i.e., minority carriers in the second semiconductor layer does not flow in the fifth semiconductor layer but exclusively flows in the third semiconductor layer. Therefore, by the carrier accumulation effect, the ON voltage can be suppressed low.

On the other hand, when to cut off the device, the predetermined gate voltage is applied to the first and second gate electrodes so that the inversion layer may be formed in the second channel, a main current constituted of residual carriers flows both in the third and fifth semiconductor layers. Since that reduces the density of the main current flowing in the third semiconductor layer during the turn-off, a withstand turn-off voltage is enhanced and a wide operating area is ensured. Further, since unlike in the CSTBT, no semiconductor layer of the second conductivity type surrounding the third semiconductor layer is needed, there arises no problem of degradation in breakdown voltage caused by that semiconductor layer. In other words, it is possible to achieve reduction in ON voltage while sustaining a high breakdown voltage and ensuring a wide operating area.

In the semiconductor device of the second aspect of the present invention, since the first and second gate electrodes are electrically connected to each other, it is not necessary to individually apply the gate voltage thereto.

In the semiconductor device of the third aspect of the present invention, since the exposed surface of the second semiconductor layer sandwiched between the third semiconductor layer and the seventh semiconductor layer is covered with the gate electrode, an even potential gradient is obtained and the electric field concentration can be relieved. Therefore, the breakdown voltage of the device is enhanced.

In the semiconductor device of the fourth aspect of the present invention, since the area of the first gate electrode covering the upper main surface is larger than that of the second gate electrode covering the upper main surface, a parasitic capacitance between the first gate electrode and the semiconductor substrate is larger. For this reason, even when the same gate voltage is applied to the end portions thereof, a change in voltage in the second gate electrode is faster than that in the first gate electrode. As a result, only by externally applying a single gate electrode, the concentration of the main current in the third semiconductor layer during the turn-off can further be relieved.

In the semiconductor device of the fifth aspect of the present invention, since the two gate electrodes are electrically insulated, it is possible to individually input the gate voltage so that the voltage at the second gate electrode is changed faster than that at the first gate electrode when the device is turned off. It thereby becomes possible to further relieve the concentration of the main current in the third semiconductor layer during the turn-off.

In the semiconductor device of the sixth aspect of the present invention, since the eighth semiconductor layer of the same conductivity type as the third semiconductor layer is formed in the surface to which the sixth semiconductor layer is exposed, the conductivity types of the first channel region and the second channel region become common. For this reason, in order to bring the device into conduction, by commonly applying the predetermined gate voltage to the first and second gate electrodes so that the inversion layers can be formed both in the channel regions, it becomes possible to restrict the path of the main current to the third semiconductor layer. That enhances the carrier accumulation effect and suppresses the ON voltage low.

On the other hand, in order to bring the device in the cut-off state, it is only necessary to commonly apply zero voltage to the first and second gate electrodes so that the inversion layer may disappear both in the channel regions. At this time, since the sixth semiconductor layer is electrically connected to the first main electrode through the eighth semiconductor layer, the main current constituted of the residual carriers flows both in the third and fifth semiconductor layers. Therefore, the withstand turn-off voltage can be enhanced and the operating area can be widely ensured. In other words, high convenience in use is achieved since it is not necessary to apply any negative voltage as a gate voltage in order to ensure reduction in the ON voltage without narrowing the operating area.

In the semiconductor device of the seventh aspect of the present invention, since the eighth semiconductor layer is selectively formed in the surface to which the second semiconductor layer is exposed, a boundary of depletion layers is made even. That enhances the breakdown voltage of the device.

In the semiconductor device of the eighth aspect of the present invention, since the eighth semiconductor layer is formed in a portion covered with neither the first gate electrode nor the second gate electrode in the exposed surface of the second semiconductor layer, the electric field concentration in the portion covered with neither the first gate electrode nor the second gate electrode is relieved and the degradation in breakdown voltage can be suppressed.

In the semiconductor device of the ninth aspect of the present invention, since the third, fifth and ninth semiconductor layers are identical in depth and impurity concentration, these semiconductor layers can be formed at the same time in a single process using the same shield. In other words, it is possible to facilitate the manufacturing process.

In the semiconductor device of the tenth aspect of the present invention, since there are a plurality of multilayer structures, more second channel regions each serving as a path in which the main current flows during the turn-off are provided as compared with a case where there is one multilayer structure. Therefore, the concentration of the main current in the third semiconductor layer can be further relieved.

In the semiconductor device of the eleventh aspect of the present invention, since the multilayer structure is so annularly formed as to surround the third semiconductor layer, the channel width of the second channel region is larger than that of the first channel region. Moreover, it is possible to easily set the MOSFET region ratio low. Therefore, the ON voltage can be further reduced while the wide operating area is kept.

In the semiconductor device of the twelfth aspect of the present invention, the eighth semiconductor layer having an impurity concentration higher than that of the third semiconductor layer is provided and connected to the first main electrode. Therefore, since the potential difference between the third semiconductor layer and the fourth semiconductor layer developed by passage of the main current can be suppressed low, the withstand latch-up voltage can be enhanced.

In the semiconductor device of the thirteenth aspect of the present invention, since the seventh semiconductor layer and the eighth semiconductor layer are common in depth and impurity concentration, these semiconductor layers can be formed at the same time in a single process using the same shield. In other words, it is possible to facilitate the manufacturing process.

In the semiconductor device of the fourteenth aspect of the present invention, since the third semiconductor layer and the fifth semiconductor layer are common in depth and impurity concentration, these semiconductor layers can be formed at the same time in a single process using the same shield. In other words, it is possible to facilitate the manufacturing process.

In the method of manufacturing a semiconductor device of the first aspect of the present invention, the semiconductor device of the first aspect can be easily manufactured by combining ordinary wafer processes including a process step of introducing the impurity.

In the method of manufacturing a semiconductor device of the second aspect of the present invention, the first and second gate electrodes are formed at the same time, and the third and fifth semiconductor layers are formed at the same time by implanting the impurity with these electrodes used as shields. That brings, as an effect, an efficient manufacture with less number of process steps, and makes it possible to determine the positional relation of the first and second gate electrodes and the third and fifth semiconductor layers with high accuracy without alignment of mask pattern.

In the method of manufacturing a semiconductor device of the third aspect of the present invention, since the first and second gate electrodes are formed at the same time as part of the single gate electrode, a device in which the first and second gate electrodes are electrically connected to each other can be achieved through a simple process.

In the method of manufacturing a semiconductor device of the fourth aspect of the present invention, the third and fifth semiconductor layers and moreover the eighth semiconductor layer can be formed at the same time by implanting the impurity with the first and second gate electrodes as shields. That brings, as an effect, an efficient manufacture with less number of process steps, and makes it possible to determine the positional relation between the portion in the exposed surface of the second semiconductor layer covered with neither the first gate electrode nor the second gate electrode and the eighth semiconductor layer with high accuracy without alignment of mask pattern.

In the method of manufacturing a semiconductor device of the fifth aspect of the present invention, the seventh and eighth semiconductor layers are formed at the same time by implanting the impurity with a single shield. That makes it possible to efficiently manufacture the device comprising the eighth semiconductor layer with less number of process steps.

These and other objects, features, aspects and advantages of the present invention will become more apparent from the following detailed description of the present invention when taken in conjunction with the accompanying drawings.

BRIEF DESCRIPTION OF DRAWINGS

FIG. 43 is an illustration showing the result of the simulation in tabular form.

BEST MODE FOR CARRYING OUT THE INVENTION

1. The First Preferred Embodiment

First, a semiconductor device in accordance with the first preferred embodiment will be discussed.

<1-1. Device Configuration>

Figure 2:
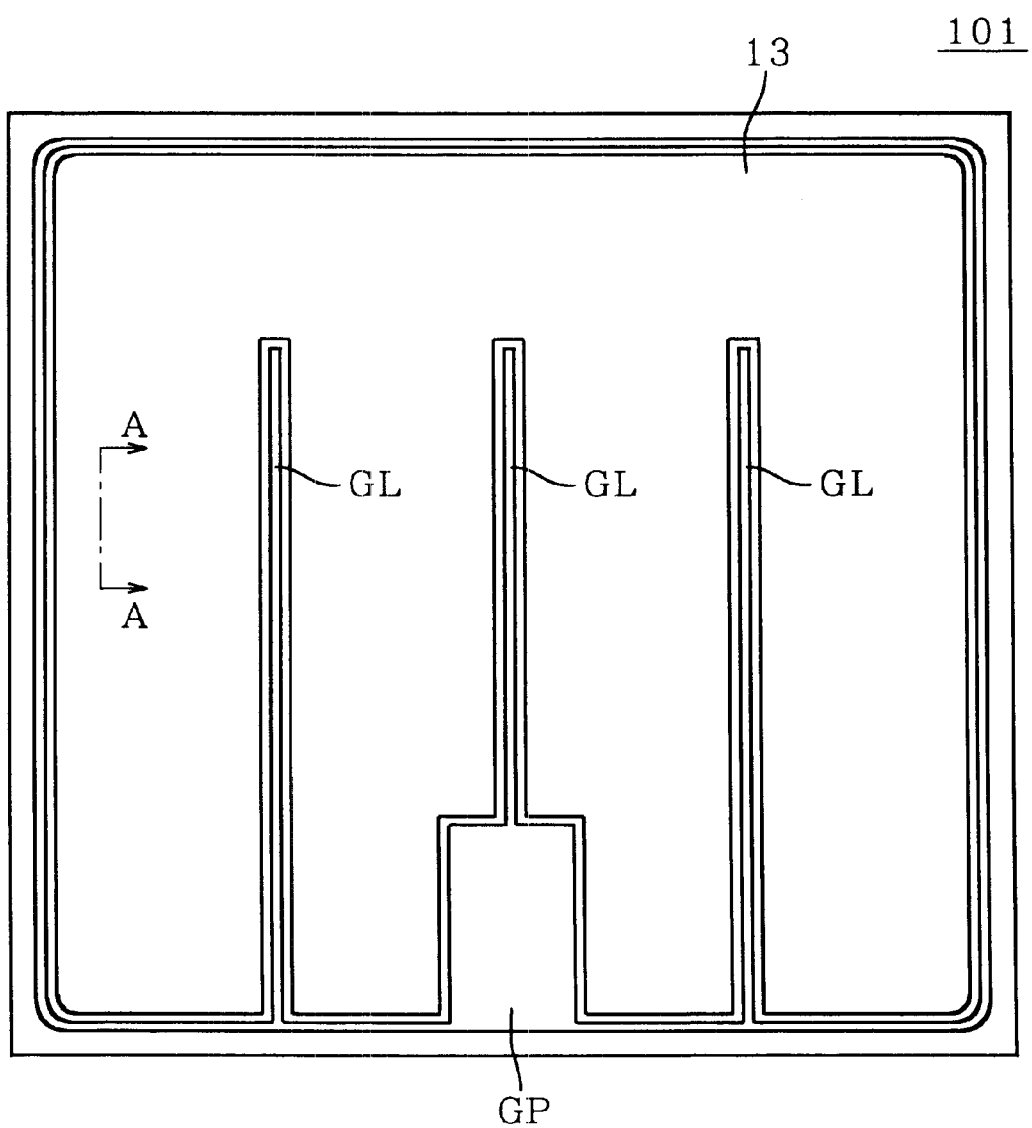
FIG. 2 is a plan view of the device in accordance with the first preferred embodiment.
Figure 41:
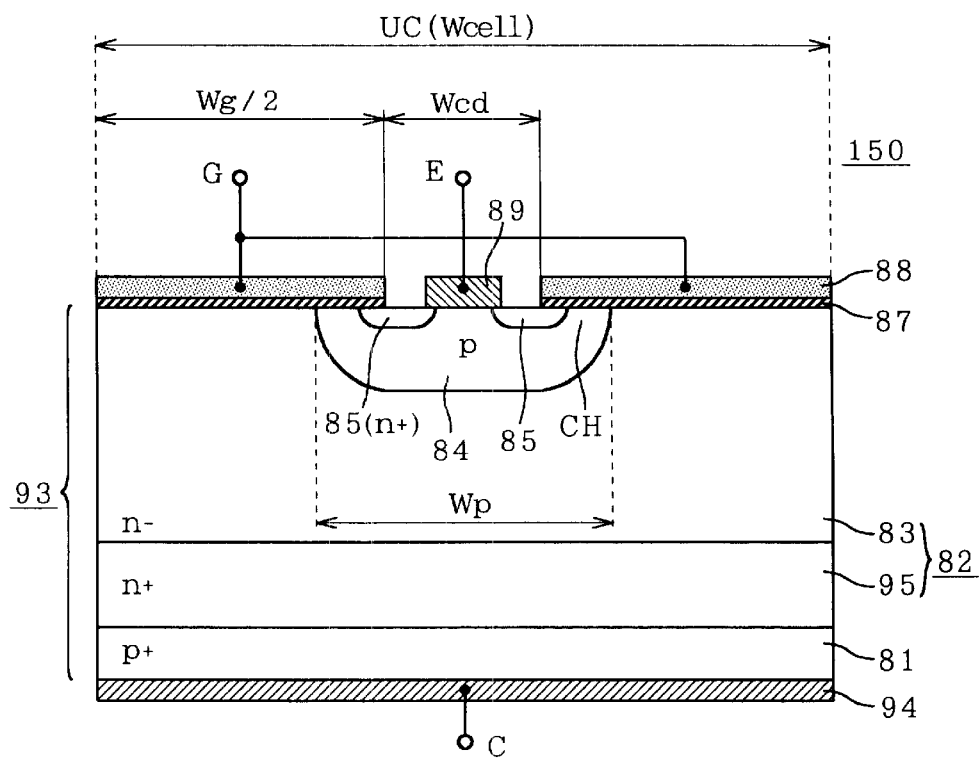
FIG. 41 is a cross-sectional elevation of a device in the background art.
Figure 42:
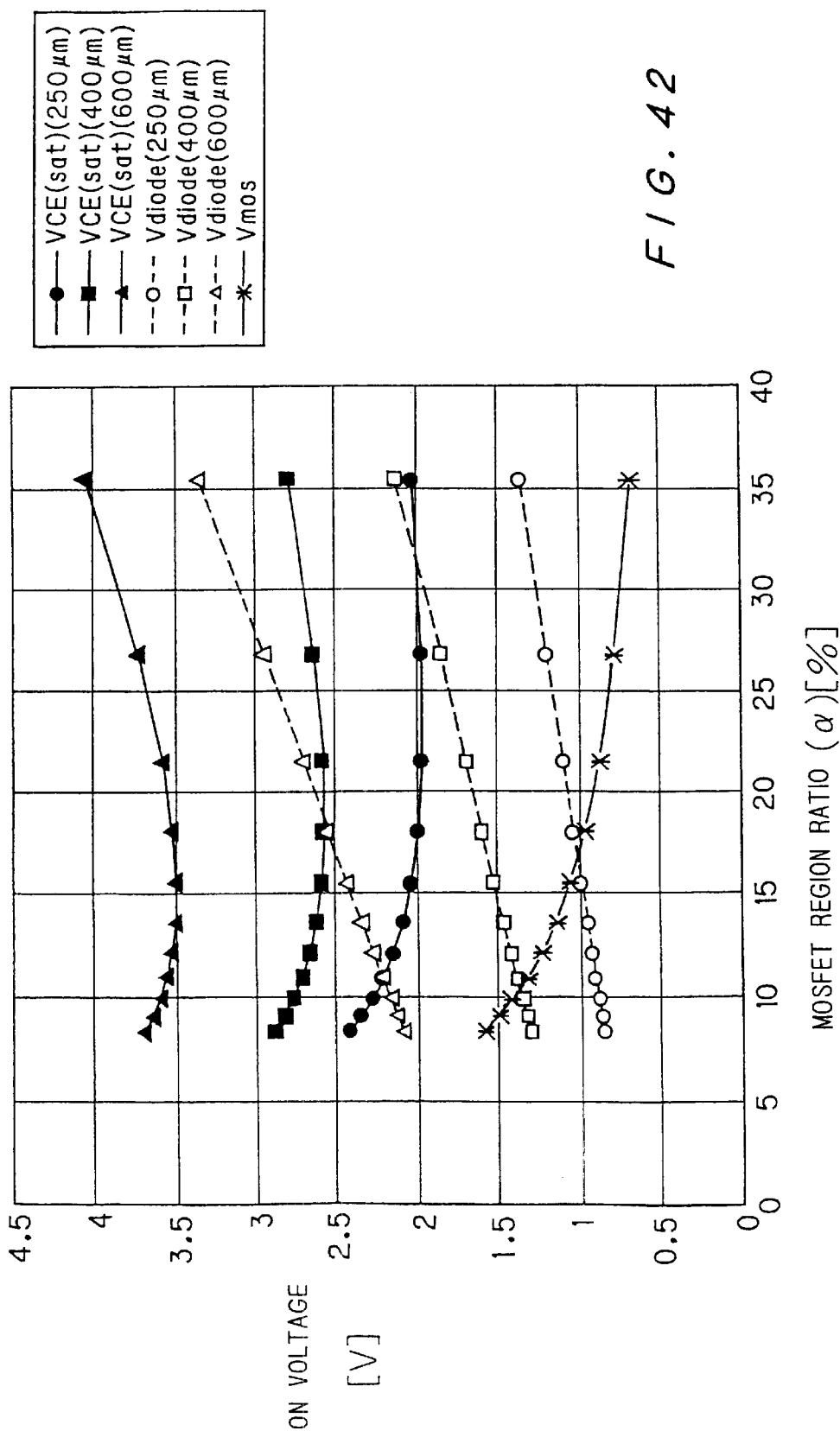
FIG. 42 is a graph showing a result of a simulation.

FIG. 2 is a plan view of the semiconductor device of this preferred embodiment. This device 101 has a structure of "vertical-type" and "planar-type" power IGBT having a lot of unit cells, like the background-art device 150 shown in FIG. 41. This applies to devices of all preferred embodiments discussed below.

As shown in FIG. 2, in an upper surface of the device 101, a rectangular gate pad GP is so provided as to be adjacent to the center portion of one side and a gate line GL is connected to the gate pad GP. The gate line GL is so provided along an outer periphery of the upper surface of the device 101 as to protrude like the teeth of a comb from one side toward its opposite side.

Specifically, the gate line GL is provided as if to equally divide the upper surface. Further, entirely over a region surrounded by the gate line GL, an emitter electrode 13 is formed. Though not shown in FIG. 2, a large number of IGBT cells as unit cells are arranged in stripes orthogonal to the gate lines GL like the teeth of a comb below the emitter electrode 13 (the back of the paper in FIG. 2).

Figure 1:
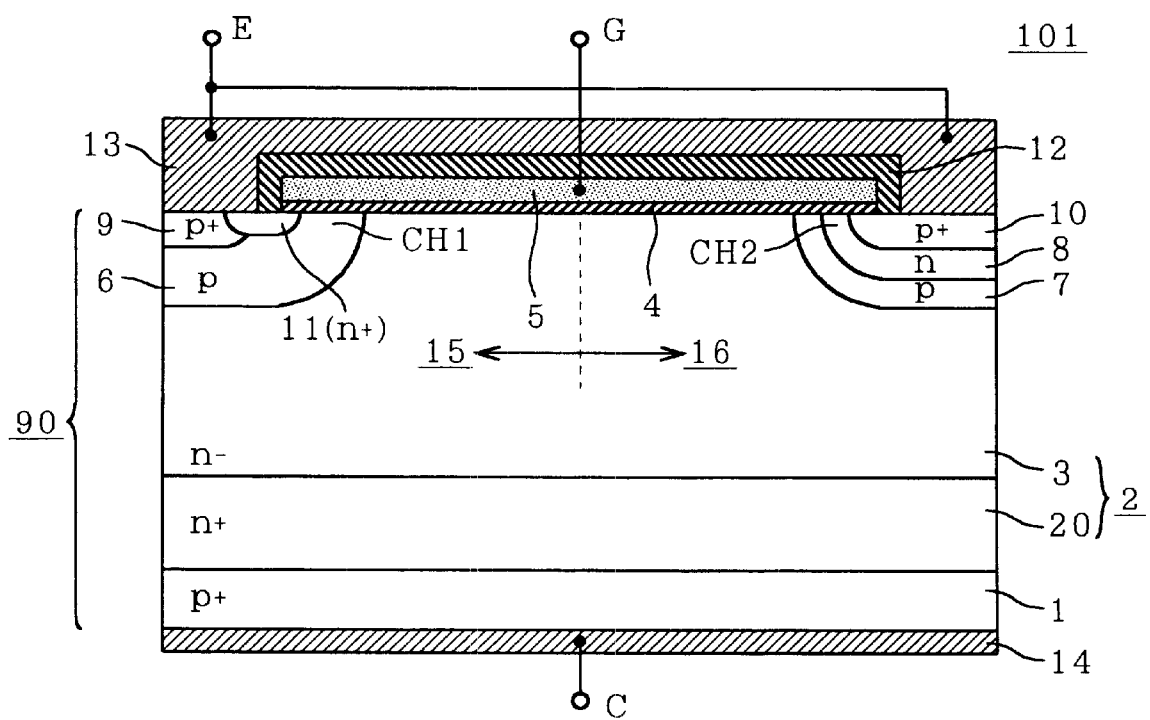
FIG. 1 is a cross-sectional elevation of a device in accordance with a first preferred embodiment.
Figure 3:
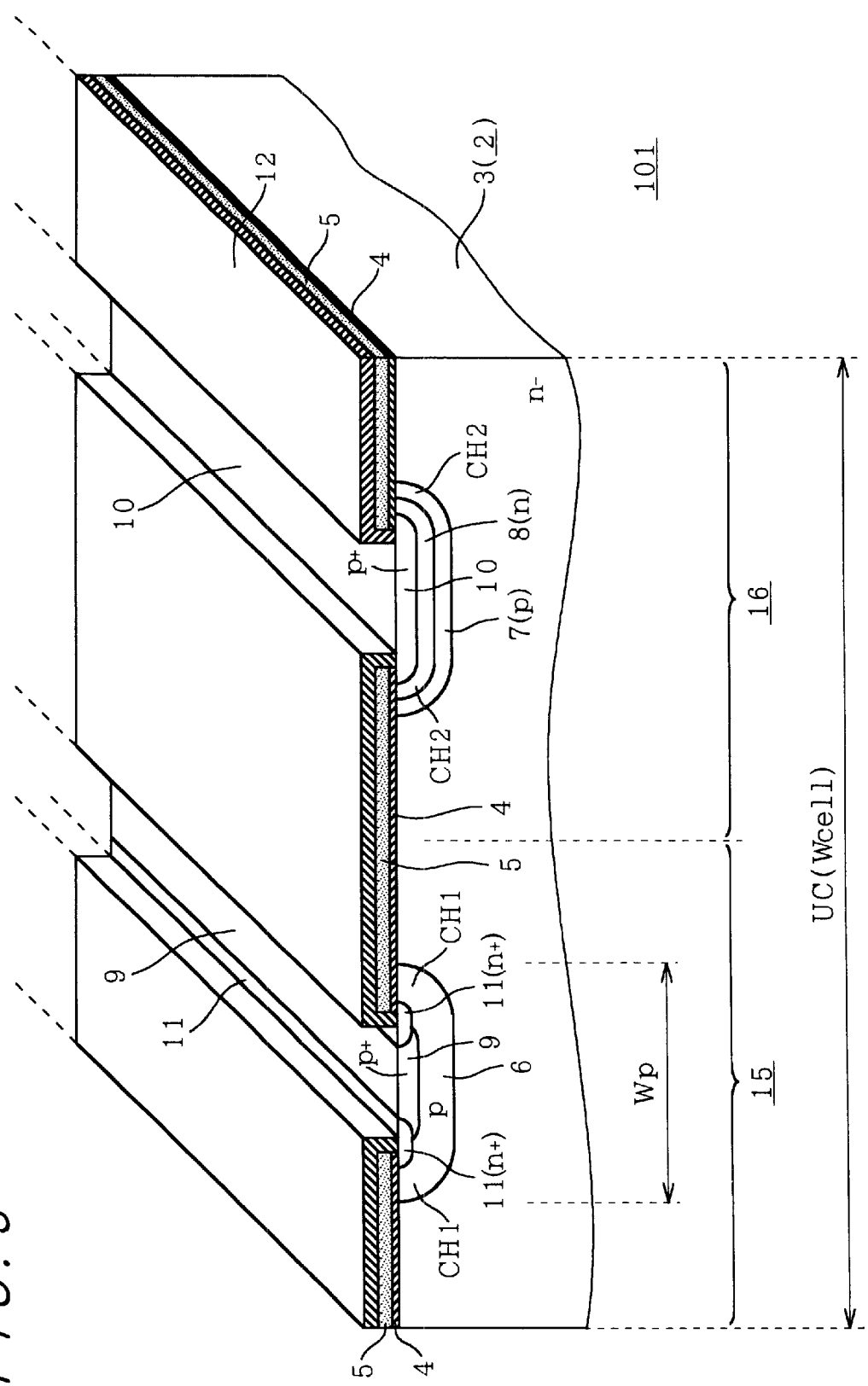
FIG. 3 is a perspective view partly in cross section of the device in accordance with the first preferred embodiment.

FIGS. 1 and 3 are cross sections of the device 101 taken along the sectional line A—A of FIG. 2. FIG. 1 shows the whole structure of half of a unit cell while FIG. 3 shows the structure of an upper portion of one unit cell in perspective. As shown in these FIGS. 1 and 3, the device 101 comprises a plane-shaped semiconductor base body 90, as a main constituent, defining an upper main surface and a lower main surface. Though the following discussion takes a case where the base material of the semiconductor base body 90 is a silicon which is most typical as a base material, it goes without saying that the present invention is not limited to this case.

The semiconductor base body 90 comprises a p collector layer 1 (the first semiconductor layer) including a p-type impurity (impurity of the first conductivity type) of high concentration and an n layer 2 (the second semiconductor layer) including an n-type impurity (impurity of the second conductivity type) formed thereon. The n layer 2 comprises an n$^+$ buffer layer 20 having a junction between itself and the p collector layer 1 and including an n-type impurity of high concentration and an n$^-$ layer 3 including an n-type impurity of low concentration and being exposed to the upper main surface of the semiconductor base body 90. The p collector layer 1 is exposed to the lower main surface of semiconductor base body 90.

One unit cell UC is divided into a first MOS region 15 and a second MOS region 16 along the main surface (the upper main surface and the lower main surface are simply and generally referred to as "main surface") of the semiconductor base body 90. In the first MOS region 15, a p base layer 6 (the third semiconductor layer) including a p-type impurity is selectively formed in a surface to which the n⁻ layer 3 is exposed. The p base layer 6 is formed to be shallower than the n⁻ layer 3. In a surface to which the p base layer 6 is exposed, an n⁺ emitter layer 11 (the fourth semiconductor layer) including an n-type impurity of high concentration is selectively formed. The n⁺ emitter layer 11 is formed to be shallower than the p base layer 6 and inside the p base layer 6.

In the surface to which the p base layer 6 is exposed, a p⁺ layer 9 (the eighth semiconductor layer) including a p-type impurity of high concentration is further selectively formed. The p⁺ layer 9 is formed to be shallower than the p base layer 6 and inside the p base layer 6. The n⁺ emitter layer 11 is divided into two regions in a single p base layer 6. The p⁺ layer 9 is selectively exposed to a first region sandwiched by the two regions of the n⁺ emitter layer 11 in the upper main surface of the semiconductor base body 90.

The concentration of the p-type impurity included in the p⁺ layer 9 is set higher than that of the p-type impurity included in the p base layer 6 and lower than that of the n-type impurity included in the n⁺ emitter layer 11. An edge of the p⁺ layer 9 along the upper main surface is so set as not to extend off an outer edge of the n⁺ emitter layer 11 along the upper main surface (herein the edges of the separated two regions facing each other are referred to as "inner edges" and those not facing each other are referred to as "outer edges"). Therefore, in two second regions sandwiched between the respective two separated regions of the n⁺ emitter layer 11 and the n⁻ layer 3 in the upper main surface of the semiconductor base body 90, the p⁺ layer 9 is not exposed but only the p base layer 6 is exposed.

In the upper main surface, an emitter electrode 13 (the first main electrode) is connected to the first region to which the p⁺ layer 9 is exposed and part of a surface to which the n⁺ emitter layer 11 is exposed. Further, on the second region to which the p base layer 6 is exposed, a gate insulating film 4 (insulating film) and a gate electrode 5 are formed. Specifically, the gate electrode 5 is opposed to the second region to which the p base layer 6 is exposed with the gate insulating film 4 sandwiched therebetween. As a result, the second region serves as a channel region CH1.

In the second MOS region 16, a p base layer 7 (the fifth semiconductor layer) including a p-type impurity is selectively formed in a surface to which the n⁻ layer 3 is exposed. The p base layer 7 is formed to be shallower than the n⁻ layer 3 and away from the p base layer 6. Further, it is preferable that the p base layer 7 is formed to be equivalent in impurity concentration and depth to the p base layer 6. In this case, it becomes possible to form the p base layer 6 and the base layer 7 in a single process by using a single mask pattern.

In a surface to which the p base layer 7 is exposed, an n layer 8 (the sixth semiconductor layer) including an n-type impurity is selectively formed. The n layer 8 is formed to be shallower than the p base layer 7 and inside the p base layer 7. Further, in a surface to which the n layer 8 is exposed, a p⁺ layer 10 (the seventh semiconductor layer) including a p-type impurity higher in concentration than that of the p base layer 7 is selectively formed. The p⁺ layer 10 is formed to be shallower than the n layer 8 and inside the n layer 8.

It is preferable that the p⁺ layer 10 is formed to be equivalent in impurity concentration and depth to the p⁺ layer 9. In this case, it becomes possible to form the p⁺ layer 9 and the p⁺ layer 10 in a single process by using a single mask pattern.

The emitter electrode 13 is connected to part of a surface to which the p⁺ layer 10 is exposed. Further, the gate electrode 5 is also opposed to a surface to which the n layer 8 is exposed with the gate insulating film 4 sandwiched therebetween. As a result, a surface to which the n layer 8 is exposed serves as a channel region CH2. The emitter electrode 13 and the gate electrode 5 are electrically insulated from each other with an interlayer insulating film 12.

A collector electrode 14 (the second main electrode) is connected to the lower main surface of the semiconductor base body 90, i.e., the surface to which the p collector layer 1 is exposed. The emitter electrode 13 and the collector electrode 14 serve as a pair of main electrodes. In the upper main surface of the semiconductor base body 90, the gate electrode 5 is opposed also to a surface to which the n⁻ layer 3 is exposed outside the p base layers 6 and 7 and a surface to which the p base layer 7 is exposed, with the gate insulating film 4 sandwiched therebetween. This makes the potential gradient along the exposed surface of the n layer 3 even and suppresses the electric field concentration, and thereby contributes to enhancement of the breakdown voltage of the device 101.

As shown in FIG. 3, various semiconductor layers selectively formed in the upper main surface of the semiconductor base body 90, including the p base layers 6 and 7, are formed in stripes along a direction where the unit cells UC extend in stripes. Further, the gate electrodes 5 are also formed in stripes in the same manner and connected to the gate lines GL (FIG. 2) at their end portions in a direction of their extension.

Furthermore, it is possible to define a portion of the gate insulating film 4 positioned on the first MOS region 15 as a first insulating film and a portion thereof positioned on the second MOS region 16 as a second insulating film. Similarly, it is possible to define a portion of the gate electrode 5 positioned over the first MOS region 15 as a first gate electrode and a portion thereof positioned over the second MOS region 16 as a second gate electrode. In the device 101, the first and second insulating films are contiguously coupled with each other as a unit to constitute the gate insulating film 4 and the first and second gate electrodes are contiguously coupled with each other to constitute the gate electrode 5. In general, however, it is possible to separately provide these elements. Such a case will be discussed in the second preferred embodiment.

<1-1. Operation of Device>

When the device 101 is used, like the background-art device 150, a power supply is connected between the emitter electrode 13 and the collector electrode 14 (usually through a load). A collector voltage is thereby applied between the collector electrode 14 and the emitter electrode 13 so that the potential at the collector electrode 14 may be positive with the emitter electrode 13 as a reference. In this configuration, by controlling a voltage applied to the gate electrode 5, i.e., a gate voltage with the emitter electrode 13 as a reference, the magnitude of a main current (collector current) flowing from the collector electrode 14 to the emitter electrode 13 can be controlled.

Figure 4:
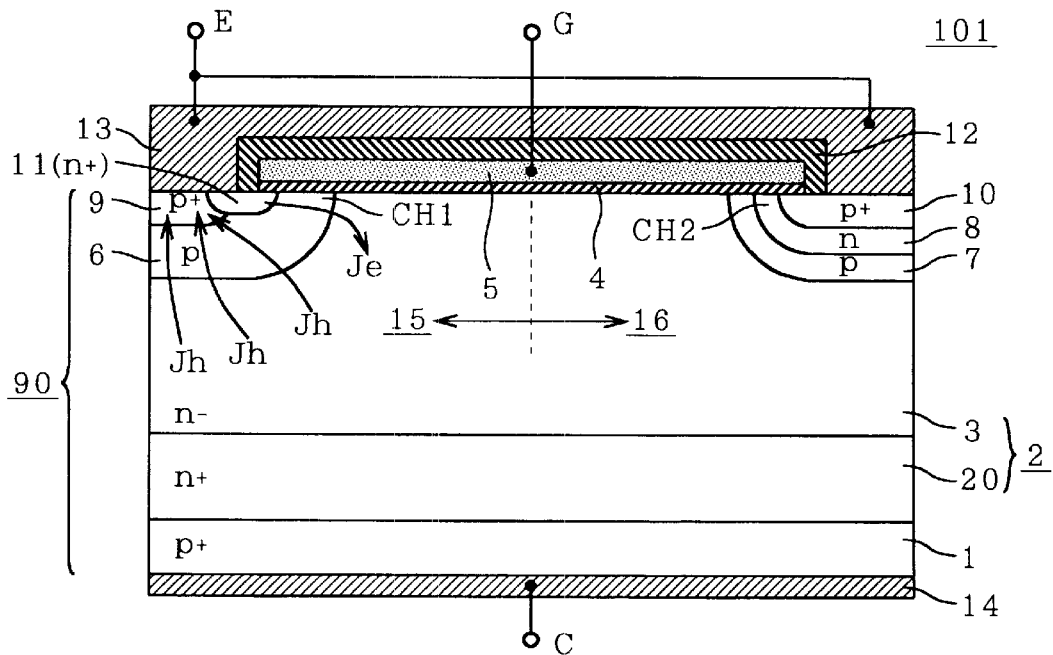
FIGS. 4 and 5 are illustrations of operation of the device in accordance with the first preferred embodiment.

When a positive voltage higher than a positive gate threshold voltage inherent to the channel region CH1 of the first MOS region 15 is applied as the gate voltage, the channel region CH1 positioned immediately below the gate electrode 5 is inverted from natural p type to n type. Namely, an n-type inversion layer is formed. As a result, as shown in FIG. 4, a flow of electrons injected from the $n^+$ emitter electrode 11 through the channel region CH1 to the $n^-$ layer 3, i.e., an electron current Je is generated. In FIG. 4, the direction of the electron current Je is represented by a direction of flow of electron not by a direction of current (a direction of flow of positive electric charges).

On the other hand, in the second MOS region 16, since the $p^+$ layer 10 is interposed between the n layer 8 and the emitter electrode 13 and a portion between the n layer 8 and the $p^+$ layer 10 is in the OFF state by reverse bias, the n layer 8 and the emitter electrode 13 is electrically insulated from each other. Therefore, electrons are not supplied from the n layer 8.

Since a portion between the p collector layer 1 and the n layer 2 (including the $n^-$ layer 3 and the $n^+$ buffer layer 20) is biased in the forward direction by the electrons injected to the $n^-$ layer 3 through the channel region CH1, holes are injected from the p collector layer 1 into the $n^-$ layer 3. As a result, the $n^-$ layer 3 causes modulation of conductivity to largely reduce its resistance, and therefore a large main current flows from the collector electrode 14 to the emitter electrode 13. In other words, the device 101 is brought into conduction (an ON state).

In the second MOS region 16, since the n layer 8 and the $p^+$ layer 10 are interposed between the p base layer 7 and the emitter electrode 13 and the a portion between the n layer 8 and the $p^+$ layer 10 is brought into the OFF state by reverse bias, the p base layer 7 and the emitter electrode 13 are electrically insulated from each other. Therefore, the main current flows to the emitter electrode 13 through the p base layer 6 and the $p^+$ layer 9, not through the p base layer 7. Specifically, a hole current Jh constituting the majority of the main current selectively flows only through the p base layer 6 among the p base layers 6 and 7.

Therefore, by setting the ratio of the base width Wp which is the width of the p base layer 6 (FIG. 3) to the cell width Wcell, i.e., the MOSFET region ratio α to any desired low value, it becomes possible to enhance the carrier accumulation effect and suppress the ON voltage to a desired low value.

Figure 5:
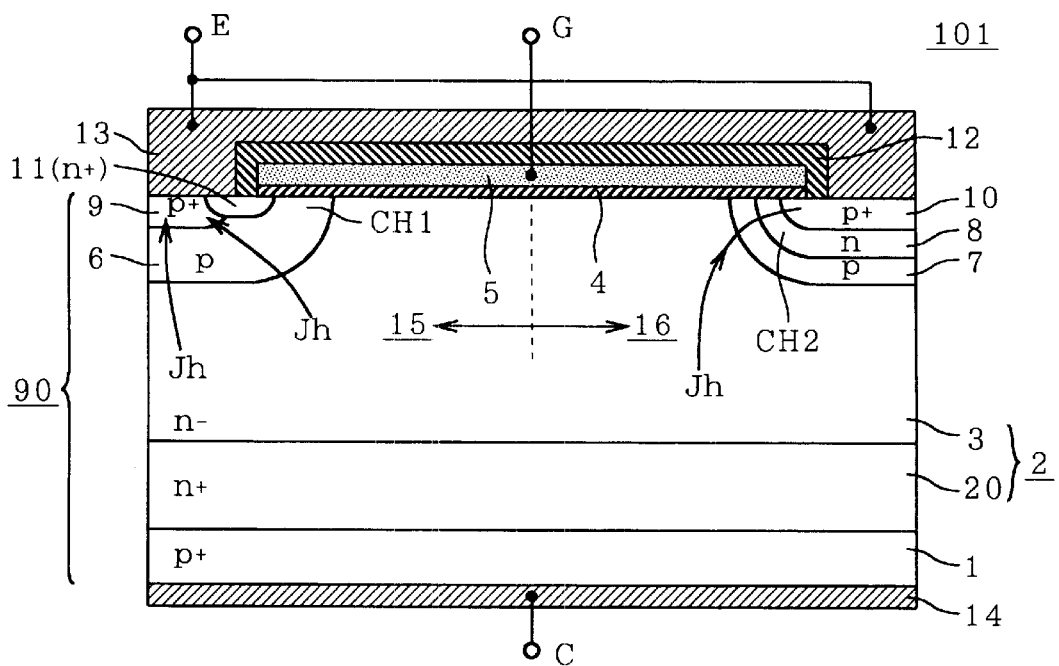

Next, when the gate voltage is changed to a negative value, the channel region CH1 is returned to the natural p type. As a result, as shown in FIG. 5, since the injection of the electrons from the $n^+$ emitter layer 11 is stopped, the injection of the holes from the p collector layer 1 is also stopped. After that, the holes accumulated in the $n^-$ layer 3 (and the $n^+$ buffer layer 20) are retrieved in the emitter electrode 13 and then extinguished. In other words, the device 101 is brought into the cut-off state (an OFF state).

In a process where the hole current Jh is attenuated during the turn-off (change from the ON state to the OFF state), the second MOS region 16 performs an important role. Specifically, when a negative voltage lower than a negative gate threshold voltage inherent to the channel region CH2 of the second MOS region 16 is applied as the gate voltage, the channel region CH2 positioned immediately below the gate electrode 5 is inverted from natural n type to p type. Namely, a p-type inversion layer is formed in the channel region CH2.

As a result, the p base layer 7 is electrically connected to the emitter electrode 13 through the channel region CH2 and the $p^+$ layer 10. Therefore, the holes accumulated in the $n^-$ layer 3 are retrieved in the emitter electrode 13 through the p base layer 7 as well as the p base layer 6. In other words, both the p base layer 6 and the p base layer 7 serve as the path of the hole current Jh during the turn-off. Therefore, since the concentration of the hole current Jh in the p base layer 6 is relieved, the breakdown voltage during the turn-off (withstand turn-off voltage) is enhanced and a wide operating area is ensured.

Thus, in the device 101, since two types of MOS regions 15 and 16 are provided, it is possible to ensure reduction in the ON voltage without narrowing the operating area. Further, unlike in the CSTBT, since there is no need of forming any n layer so as to surround the p base layer 6, the problems of degradation in breakdown voltage and operation failure inherent to the CSTBT do not rise.

Further, since the $p^+$ layers 9 and 10 are so formed as to have an impurity concentration higher than that of the p base layers 6 and 7, the voltage drop developed by passage of the hole current Jh can be suppressed low. Therefore, an advantage of excellent latch-up resistance can be obtained. Further, since the $n^+$ buffer layer 20 is provided, it becomes possible to make the $n^-$ layer 3 thinner while preventing punch through.

<1-3. Method of Manufacturing The Device>

Figure 6:
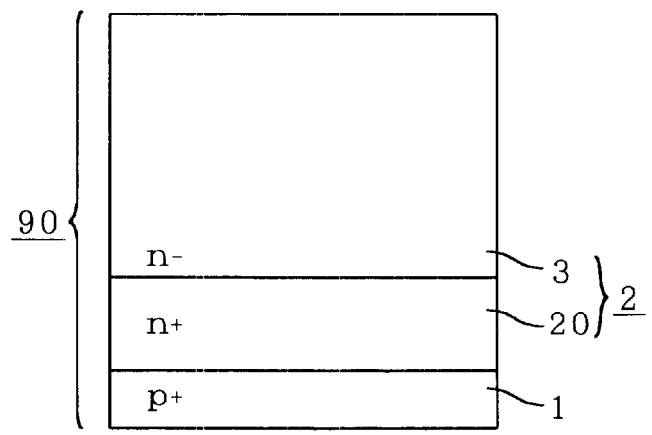
FIGS. 6 to 15 are views showing a manufacturing process of the device in accordance with the first preferred embodiment.

FIGS. 6 to 15 are manufacturing-process diagrams showing a preferable method of manufacturing the device 101. To manufacture the device 101, the plane-shaped semiconductor base body 90 whose base material is a silicon is prepared as shown in FIG. 6. In the semiconductor base body 90, the p collector layer 1, the $n^+$ buffer layer 20 formed thereon and the $n^-$ layer 3 formed further thereon are provided from the lower main surface toward the upper main surface.

To form the semiconductor base body 90, a p-type silicon substrate, for example, corresponding to the p collector layer 1 is first prepared and then the $n^+$ buffer layer 20 and the $n^-$ layer 3 are sequentially layered on one of its main surfaces by epitaxial growth method. The $n^+$ buffer layer 20 and the $n^-$ layer 3 which are different in impurity concentration from each other can be obtained, for example, by stepwise changing the amount of impurity to be introduced in the process of epitaxial growth.

Figure 7:
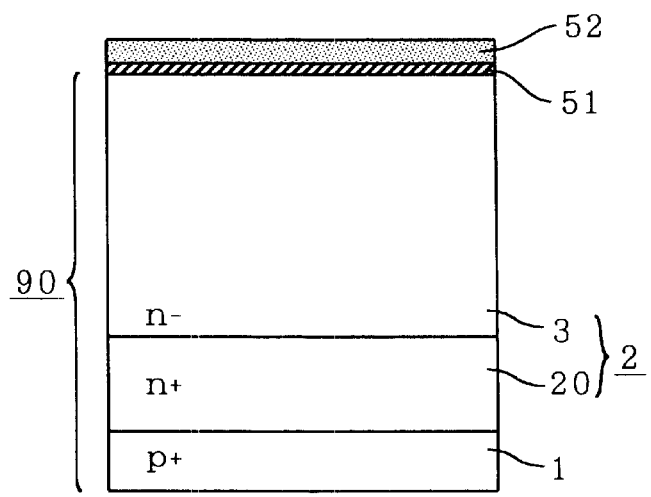

In the next step of FIG. 7, first, an insulating film 51 which is an original of the gate insulating film 4 is formed on the upper main surface of the semiconductor base body 90. The insulating film 51 is preferably made of a silicon oxide. Subsequently, a conductive material 52 which is a material of the gate electrode is deposited on the insulating film 51 in a form of layer. The conductive material 52 is preferably made of a polysilicon doped with an impurity in high concentration.

Figure 8:
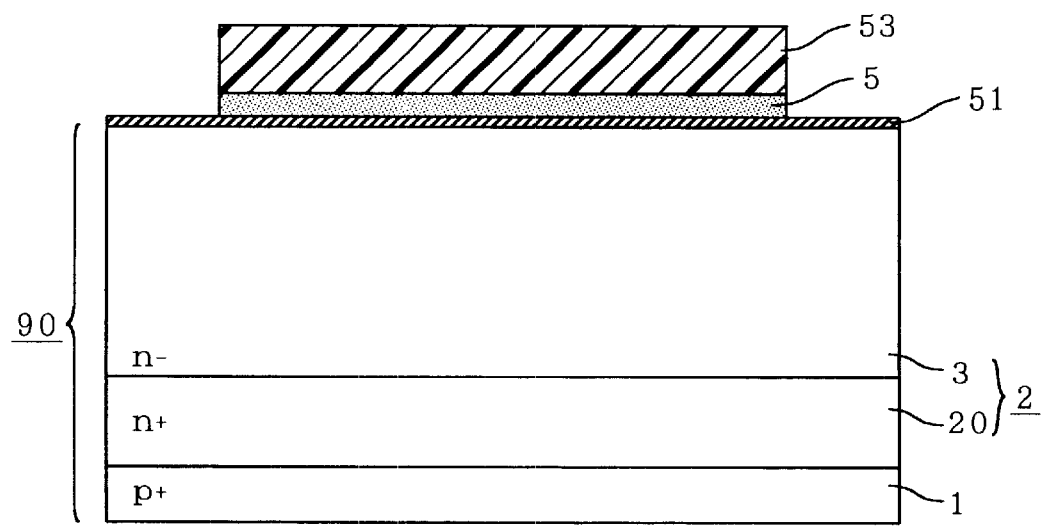

In the next step of FIG. 8, first, a resist layer 53 patterned with a configuration of the gate electrode 5 to be formed is formed on the insulating film 51. After that, with the resist layer 53 as a shield, the conductive material 52 is selectively etched. As a result, the conductive material 52 is selectively removed to form the gate electrode 5. The resist layer 53 can be obtained by using a conventionally well-known technique where patterning is performed by photolithography after a material of the resist layer 53 is formed on the conductive material 52 in a form of layer.

Figure 9:
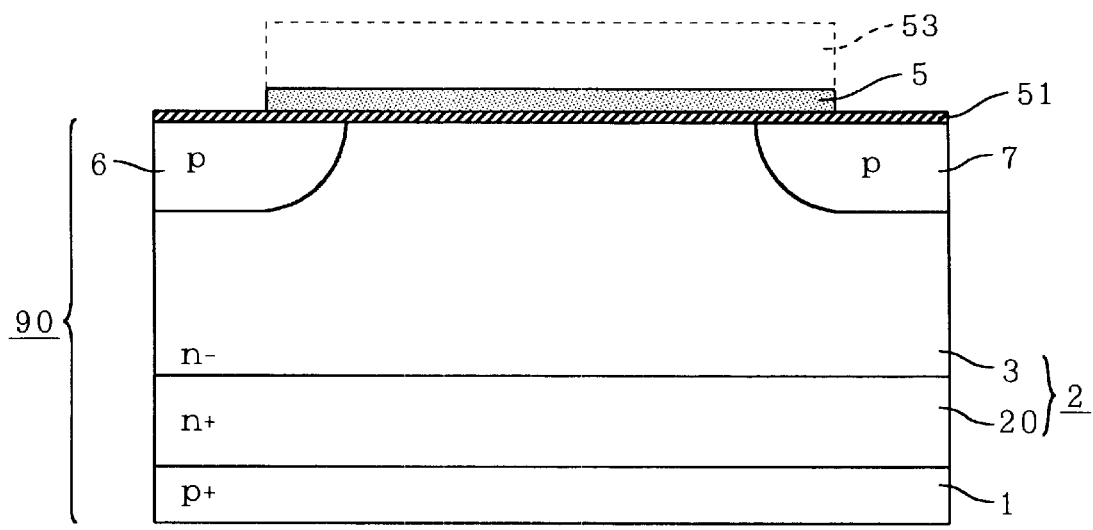

In the next step of FIG. 9, first, a p-type impurity, e.g., boron is selectively implanted in the upper main surface of the semiconductor base body 90 with the resist layer 53 and the gate electrode 5 used as shields. Then, after removing the resist layer 53, a diffusion process where the impurity is diffused by annealing is performed. As a result, the p base layers 6 and 7 are selectively formed in the surface to which the $n^-$ layer 3 is exposed in the upper main surface of the semiconductor base body 90. The p base layers 6 and 7 also enter a portion immediately below the gate electrode 5 in the upper main surface of the semiconductor base body 90, to some degree.

Figure 10:
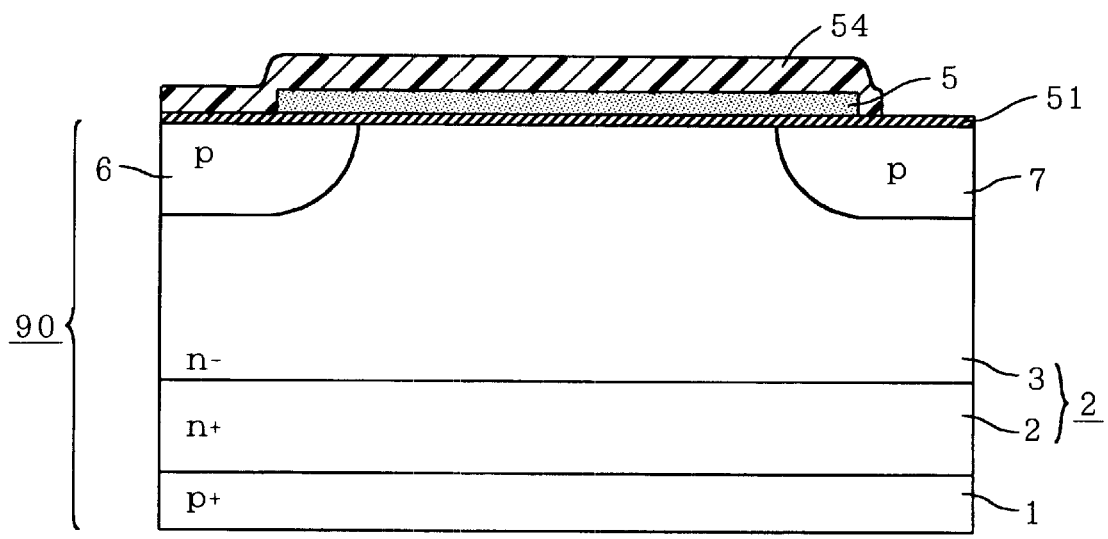

Subsequently, as shown in FIG. 10, a resist layer 54 selectively covering an exposed surface over the semiconductor base body 90 is formed. The resist layer 54 selectively has an opening over a region inside the portion to which the p base layer 7 is exposed in the upper main surface of the semiconductor base body 90.

Figure 11:
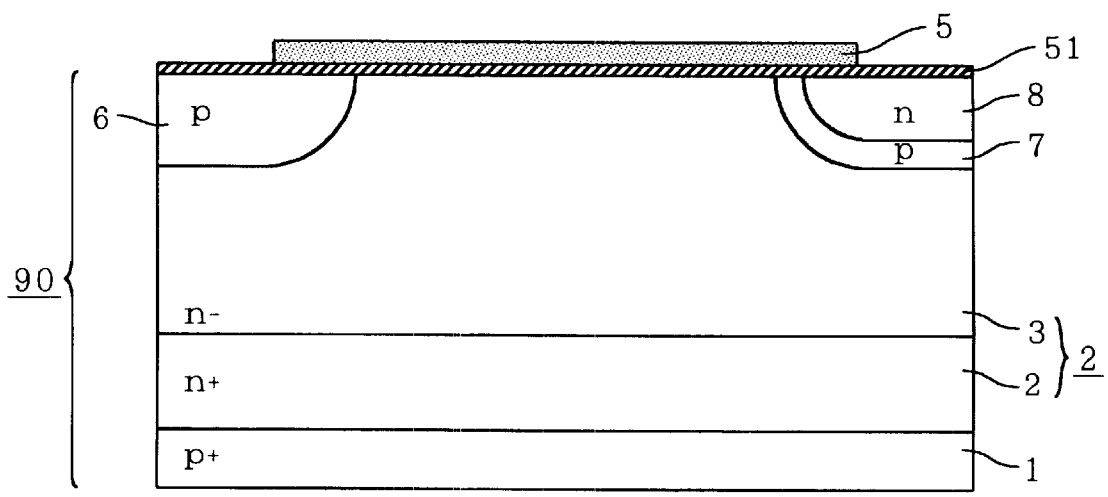

In the next step of FIG. 11, first, an n-type impurity, e.g., phosphorus is selectively implanted in the upper main surface of the semiconductor base body 90 with the resist layer 54 used as a shied. Then, after removing the resist layer 54, the diffusion of the impurity is performed. As a result, the n layer 8 is selectively formed in the surface in which the p base layer 7 is exposed to the upper main surface of the semiconductor base body 90. The position of edges of the opening in the resist layer 54 and the diffusion condition are set so that the n layer 8 may also enter a portion immediately below the gate electrode 5 in the surface to which the p base layer 7 is exposed, to some degree. Further, the n layer 8 is formed to be shallower than the p base layer 7 and inside the p base layer 7.

Figure 12:
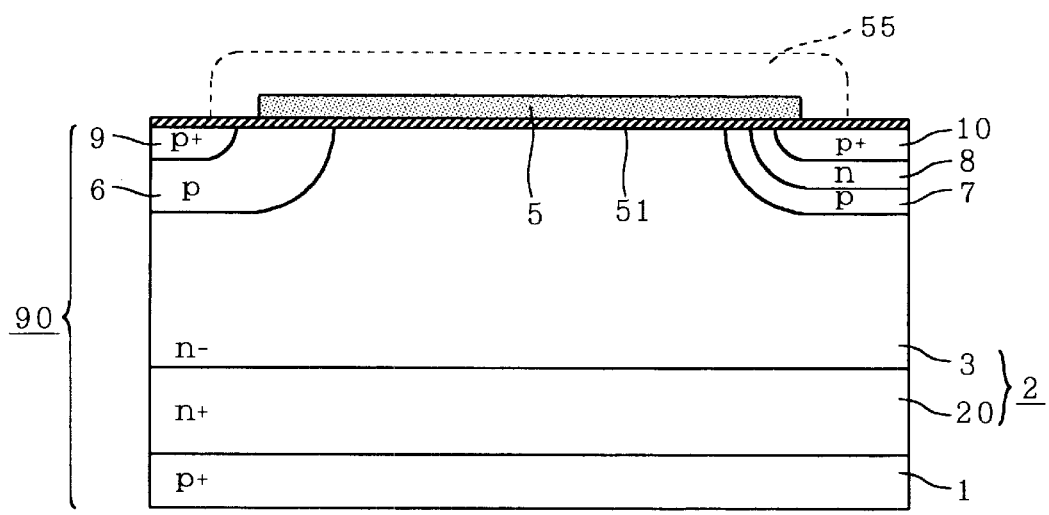

In the next step of FIG. 12, first, a resist layer 55 is so formed as to selectively cover an upper surface and a side surface of the gate electrode 5. Subsequently, a p-type impurity, e.g., boron, of high concentration is implanted in the upper main surface of the semiconductor base body 90 with the resist layer 55 used as a shied. Then, after removing the resist layer 55, the diffusion of the impurity is performed.

As a result, the $p^+$ layer 9 is selectively formed in the surface in which the p base layer 6 is exposed to the upper main surface of the semiconductor base body 90. In the same manner, the $p^+$ layer 10 is selectively formed in the surface to which the n layer 8 is exposed. The $p^+$ layers 9 and 10 are formed to be shallower than the p base layer 6 and the n layer 8 and inside the p base layer 6 and the n layer 8, respectively. Further, the $p^+$ layer 10 is formed so that its edge may be positioned at the edge of or inside the portion immediately below the gate electrode 5 in the upper main surface of the semiconductor base body 90. In other words, the edge of the $p^+$ layer 10 is positioned so that the surface in which the n layer 8 is exposed to the upper main surface of the semiconductor base body 90 may be opposed to the gate electrode 5 over the whole width from the interface with the $p^+$ layer 10 to the interface with the p base layer 7.

Figure 13:
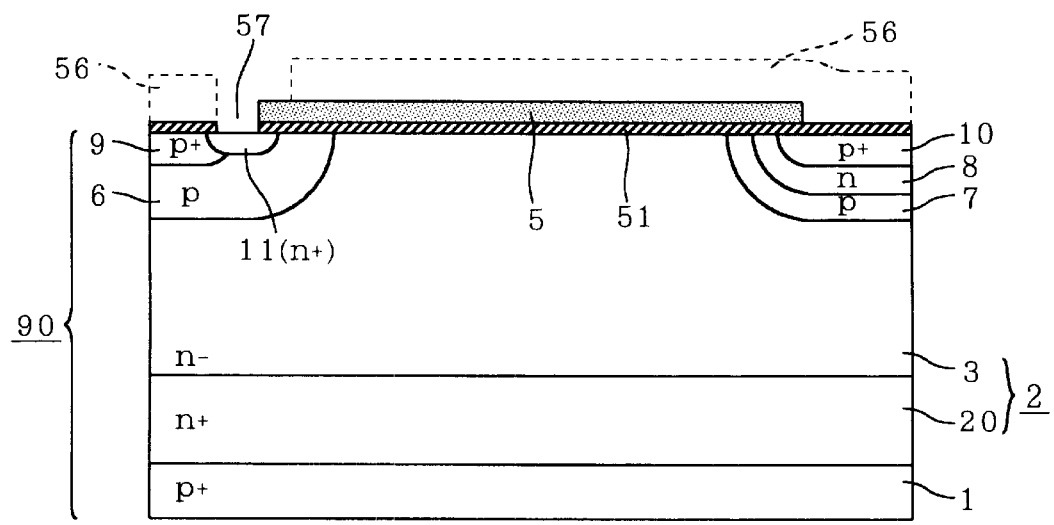

In the next step of FIG. 13, first, a resist layer 56 is so formed as to selectively cover an exposed surface over the semiconductor base body 90. The resist layer 56 selectively has an opening 57 which is selectively provided in a certain range from the edge of the gate electrode 5 over the surface in which the p base layer 6 or the $p^+$ layer 9 are exposed to the upper main surface of the semiconductor base body 90 and outside the gate electrode 5. One end of the opening 57 may be positioned on the gate electrode 5 as shown in FIG. 13.

Next, the insulating film 51 is selectively removed with the resist layer 56 used as a shield. Subsequently, an n-type impurity, e.g., arsenic is implanted in high concentration in the upper main surface of the semiconductor base body 90 with the resist layer 56, the gate electrode 5 and the insulating film 51 used as shields. Then, after removing the resist layer 56, the diffusion of the impurity is performed. As a result, the $n^+$ emitter layer 11 is selectively formed in the surface in which the p base layer 6 or the $p^+$ layer 9 are exposed to the upper main surface of the semiconductor base body 90. The $n^+$ emitter layer 11 is formed to be shallower than the p base layer 6 and inside the p base layer 6. Further, the $n^+$ emitter layer 11 is so formed as to also enter the portion immediately below the gate electrode 5 and intersect the $p^+$ layer 9.

The impurity concentration of the $n^+$ emitter layer 11 is set higher than that of the $p^+$ layer 9. As a result, in a region where the $n^+$ emitter layer 11 and the $p^+$ layer 9 intersect each other, the $p^+$ layer 9 is replaced with the $n^+$ emitter layer 11. Though the edge of the $p^+$ layer 9 may be positioned immediately below the gate electrode 5 in the step of FIG. 12, after the step of FIG. 13, one of the edges of the $n^+$ emitter layer 11 is positioned so that all the surfaces in the portion of the upper main surface immediately below the gate electrode 5 to which the $p^+$ layer 9 is exposed may be replaced with the $n^+$ emitter layer 11 and the $p^+$ layer 9 may not be exposed. At the same time, in a portion of the upper main surface outside the portion immediately below the gate electrode 5, the other of the edges of the $n^+$ emitter layer 11 is positioned so that the $n^+$ emitter layer 11 and the $p^+$ layer 9 may be exposed and the p base layer 6 may not be exposed.

Further, in the step of FIG. 13, there may be a case where the resist layer 56 is so formed as not to cover the upper surface of the gate electrode 5 and the arsenic is also implanted into the gate electrode 5 during the implantation of arsenic. That can reduce the electric resistance of the gate electrode 5.

Figure 14:
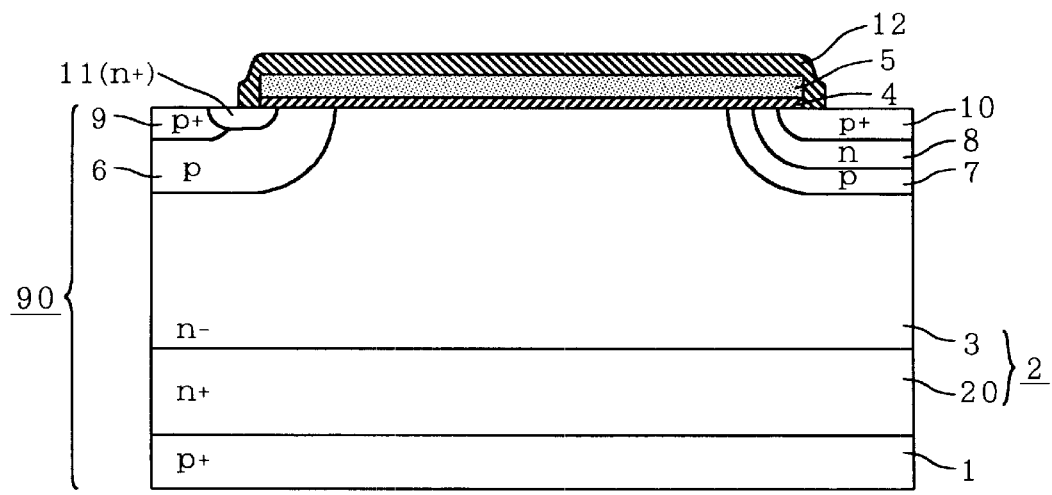

Next, as shown in FIG. 14, the interlayer insulating film 12 covering the upper surface and the side surface of the gate electrode 5 is formed. The interlayer insulating film 12 is formed by so depositing a material of the interlayer insulating film 12 in a form of layer at to cover the whole exposed surface over the semiconductor base body 90 and then patterning the material having a form of layer with photolithography. At this time, a portion of the insulating film 51 not covered with the interlayer insulating film 12 is also concurrently removed. As a result, the gate insulating film 4 is formed from the insulating film 51. The patterning of the interlayer insulating film 12 and the insulating film 51 is performed so that at least part of the $p^+$ layer 9, part of the $p^+$ layer 10 and part of the $n^+$ emitter layer 11 may be exposed.

Figure 15:
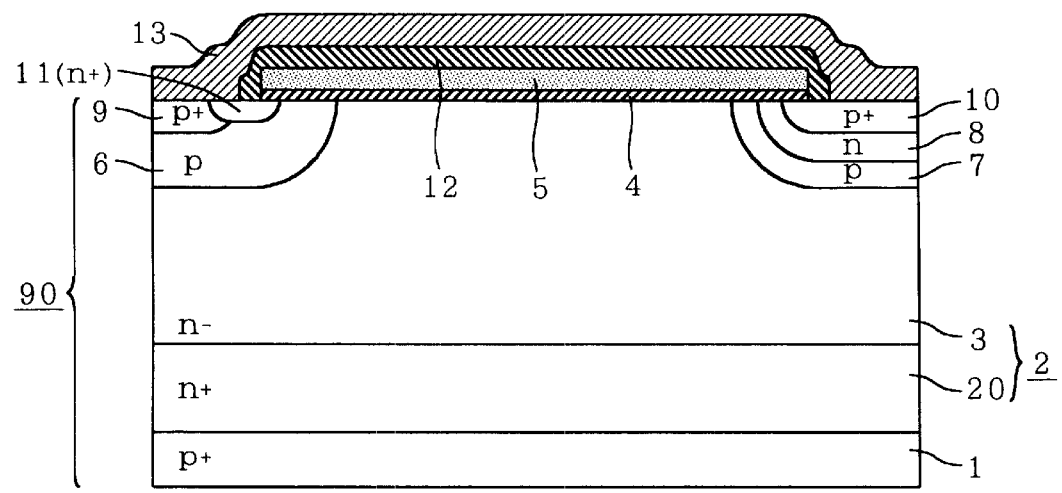

In the next step of FIG. 15, first, a conductive material whose base material is, e.g., an aluminum is deposited in a form of layer on the exposed surface over the semiconductor base body 90. After that, patterning is made in the configuration of the emitter electrode 13 and the gate lines GL as shown in FIG. 2. As a result, as shown in FIG. 15, at least part of the $p^+$ layer 9, part of the $p^+$ layer 10 and part of the $n^+$ emitter layer 11 are connected to the emitter electrode 13.

After that, as shown in FIG. 1, the collector electrode 14 is connected to the lower main surface of the semiconductor base body 90, i.e., the surface to which the p collector layer 1 is exposed. The collector electrode 14 is made of a conductive material whose base material is, e.g., an aluminum. Through the above process steps, the device 101 is completed.

Thus, the device 101 can be easily manufactured by combining the ordinary wafer process mainly constituted of the deposition process and the processes of implanting and diffusing the impurity. Moreover, since the p base layer 6 and the p base layer 7 are formed at the same time and the $p^+$ layer 9 and the $p^+$ layer 10 are formed at the same time, an advantage of especially simple process can be obtained.

2. The Second Preferred Embodiment

Figure 16:
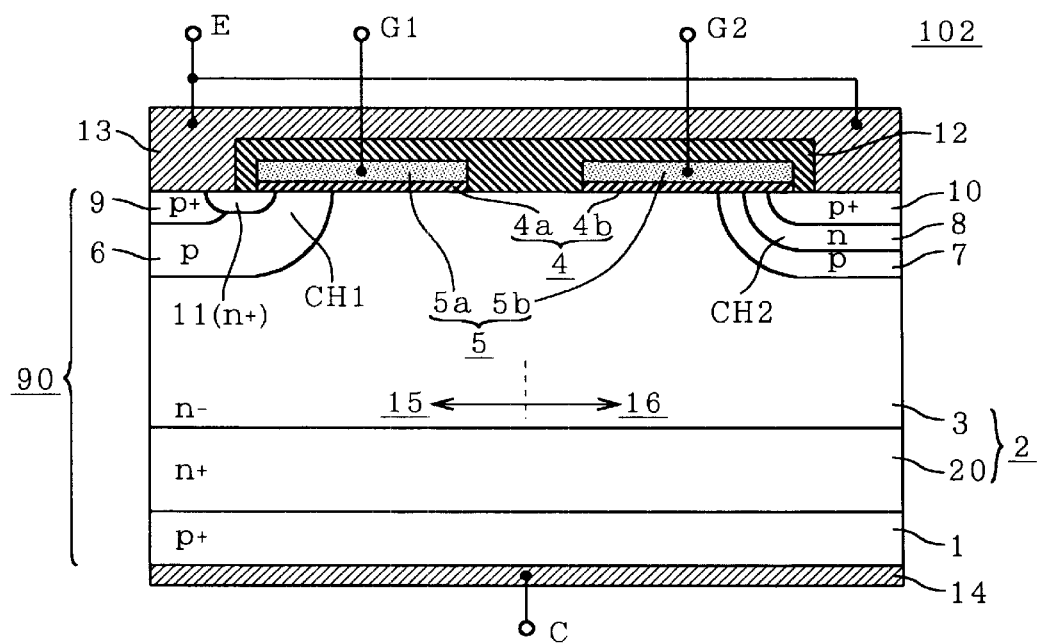
FIG. 16 is a cross-sectional elevation of a device in accordance with a second preferred embodiment.

FIG. 16 is a cross-sectional elevation of a device in accordance with the second preferred embodiment. FIG. 16 also shows half of a unit cell like FIG. 1. This device 102 is characteristically different from the device 101 in that the gate electrode 5 is separated into a gate electrode 5a (the first gate electrode) and a gate electrode 5b (the second gate electrode) positioned over the first and second MOS regions 15 and 16, respectively, and the gate insulating film 4 is separated into a gate insulating film 4a (the first insulating film) and a gate insulating film 4b (the second insulating film) positioned over the first and second MOS regions 15 and 16, respectively.

The gate electrode 5a includes a portion opposed to the channel region CH1 with the gate insulating film 4a sandwiched therebetween and the gate electrode 5b includes a portion opposed to the channel region CH2 with the gate insulating film 4b sandwiched therebetween. It is possible to separately apply the gate voltage to the gate electrode 5a and the gate electrode 5b.

Figure 17:
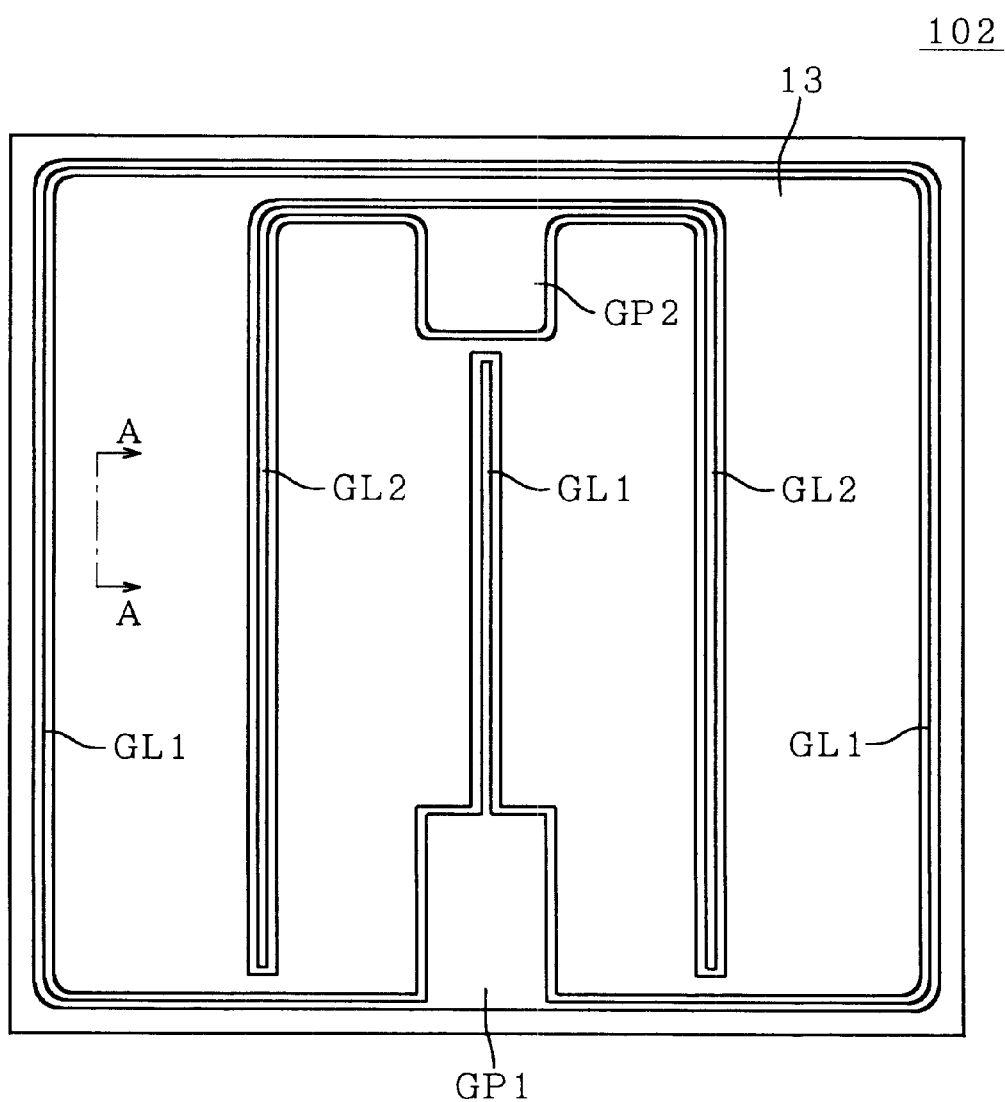
FIG. 17 is a plan view of the device in accordance with the second preferred embodiment.

FIG. 17 is a plan view of the device 102. In the device 102, the gate pad GP is separated into two kinds of gate pads GP1 and GP2 so that the two kinds of gate electrodes 5a and 5b can be separately driven. Further, gate lines GL1 and GL2 are connected to the gate pads GP1 and GP2, respectively. The gate lines GL1 and GL2 are each so provided as to protrude like the teeth of a comb and alternately arranged. A large number of unit cells are arranged in stripes orthogonal to the gate lines GL1 an GL2.

Figure 18:
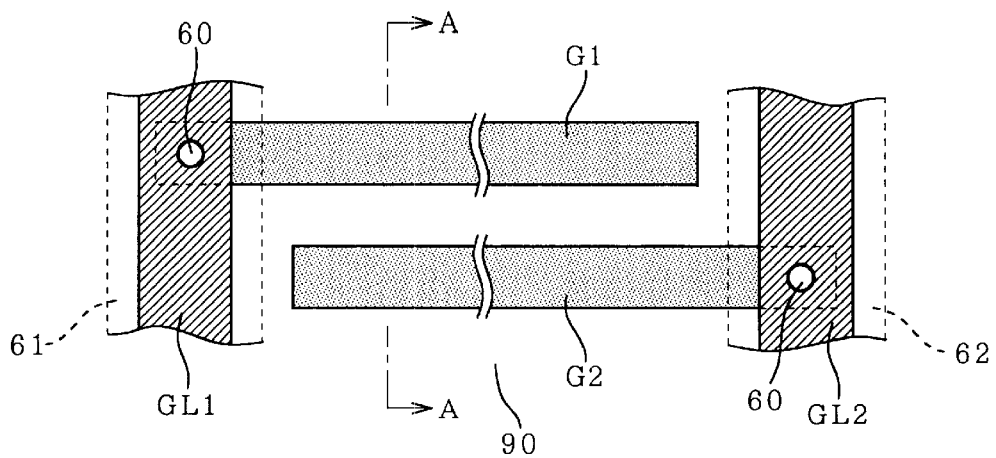
FIG. 18 is a partly enlarged plan view of the device in accordance with the second preferred embodiment.

As shown in the partly enlarged plan view of FIG. 18, one end of the unit cell reaches the gate line GL1 and the other end reaches the gate line GL2. Further, one end of the gate electrode 5a (G1) is connected to the gate line GL1 through a contact hole 60 and one end of the gate electrode 5b (G2) is connected to the gate line GL2 through the contact hole 60.

Another gate lines 61 and 62 both of which are made of the same material (e.g., polysilicon) as the gate electrodes 5a and 5b are provided immediately below the gate lines GL1 and GL2, in parallel to the gate lines GL1 and GL2, respectively, over the upper main surface of the semiconductor base body 90. The gate lines 61 and 62 are contiguously coupled to the gate electrodes 5a and 5b, respectively, and can be formed at the same time in the process of forming the gate electrodes 5a and 5b. FIG. 16 is a cross section taken along the A—A sectional line of FIGS. 17 and 18.

Figure 19:
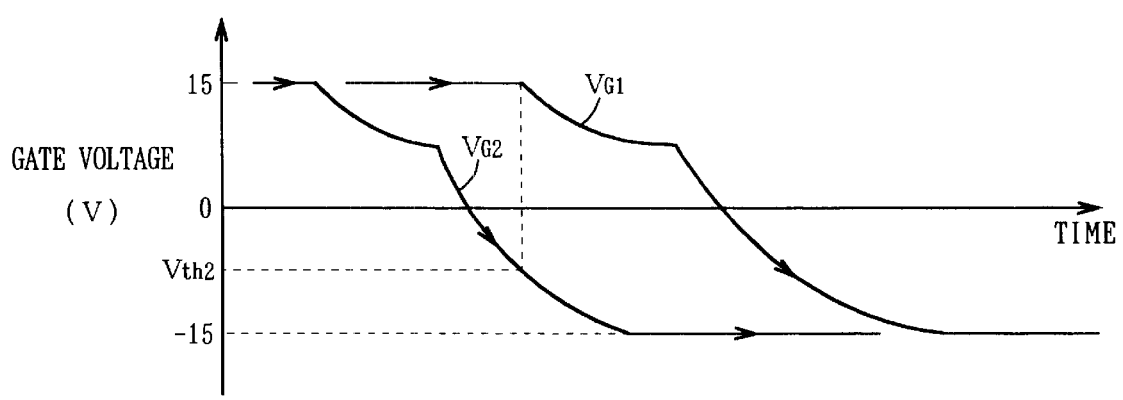
FIG. 19 is a graph showing a use of the device in accordance with the second preferred embodiment.

FIG. 19 is a graph showing waveforms of gate voltages applied to the gate electrodes 5a and 5b in a manner to effectively take the advantage of the device 102. In this example, a voltage of +15 V is applied as the gate voltage both to the gate electrodes 5a and 5b in order to bring the device 102 into conduction and a voltage of −15 V is applied thereto in order to bring the device 102 into the cut-off state. When the device 102 is turned off, a gate voltage $V_{G2}$ applied to the gate electrode 5b is lowered faster than a gate voltage $V_{G1}$ applied to the gate electrode 5a. Specifically, the gate voltage $V_{G1}$ is not lowered until the gate voltage $V_{G2}$ gets lowered beyond a negative gate threshold voltage $V_{th2}$ of the channel region CH2.

As a result, during the turn-off, the ratio of the hole current Jh passing the p base layer 7 is increased and the hole current Jh passing the p base layer 6 is thereby suppressed low. Therefore, the withstand turn-off voltage is further enhanced and a still wider operating area is ensured. Thus, in the device 102, since the two kinds of channel regions CH1 and CH2 can be separately controlled, it is possible to further enlarge the operating area.

Figure 20:
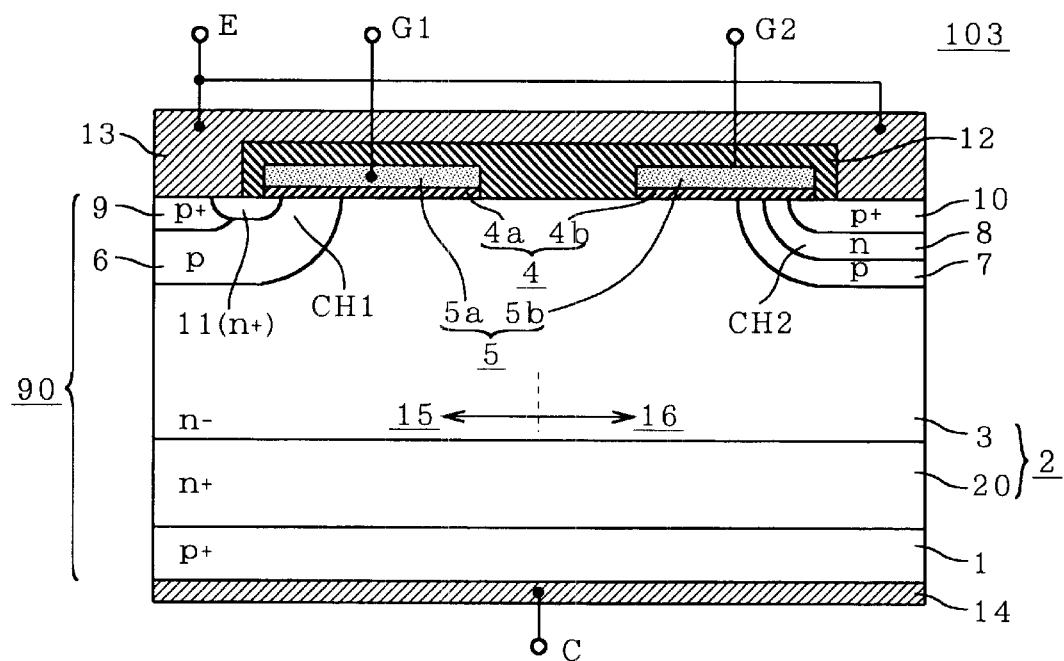
FIG. 20 is a cross-sectional elevation showing another example of a device in accordance with the second preferred embodiment.
Figure 21:
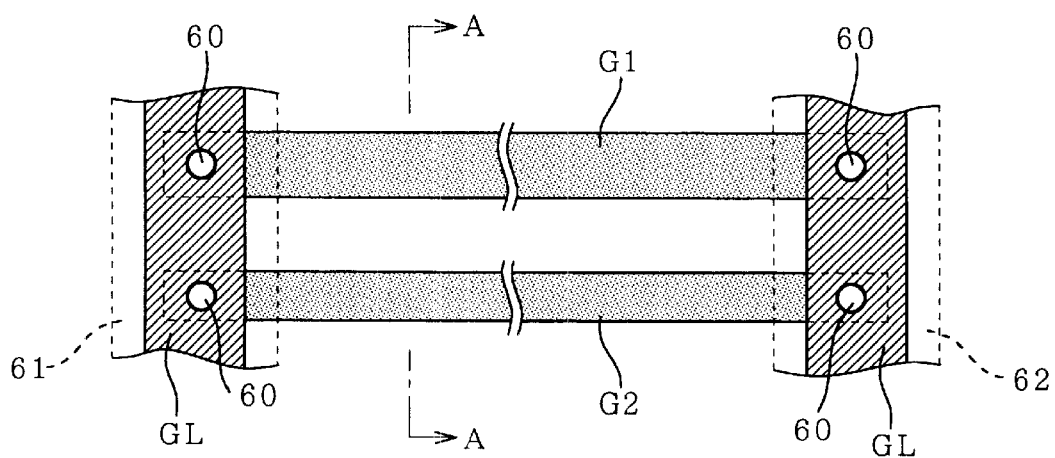
FIG. 21 is a partly enlarged plan view showing another example of a device in accordance with the second preferred embodiment.

FIG. 20 is a cross section showing a device which is a variation of the device 102. In this device 103, the widths of the gate electrodes 5a and 5b are not equal and the width of the gate electrode 5b is set narrower than that of the gate electrode 5a. Further, as shown in the partly enlarged plan view of FIG. 21, in the device 103, the gate lines GL1 and GL2 are not distinguished from each other and both the gate electrodes 5a and 5b are connected to the gate line GL and electrically coupled to each other. The whole plan view of the device 103 is the same as FIG. 2, and the gate lines GL are arranged in the same manner as shown in FIG. 2. The A—A sectional line in FIG. 21 coincides with that in FIG. 2 and FIG. 20 corresponds to a cross section taken along this A—A sectional line.

In the device 103, the end portions of both the gate electrodes 5a and 5b are connected to a common gate line GL and the gate voltage inputted to a single gate pad GP is applied both to the gate electrodes 5a and 5b. Since the gate electrode 5b is narrower than the gate electrode 5a, however, the area of the gate electrode 5b covering the upper main surface of the semiconductor base body 90 is smaller than that of the gate electrode 5a covering it. Therefore, the parasitic capacitance generated between the gate electrode 5b and the semiconductor base body 90 is smaller than that generated between the gate electrode 5a and the semiconductor base body 90. As a result, in comparison of the speed at which the gate voltage inputted to the common gate pad GP is propagated through the gate electrodes 5a and 5b, the speed of propagation through the gate electrode 5b is higher than that through the gate electrode 5a.

Therefore, in a region away from the gate line GL to some extent, the gate voltage $V_{G2}$ applied to the gate electrode 5b drops earlier than the gate voltage $V_{G1}$ applied to the gate electrode 5a during the turn-off. In other words, even though a single gate voltage is externally inputted to the gate pad GP, the gate voltages $V_{G1}$ and $V_{G2}$ change in a manner equivalent or approximate to that shown in FIG. 19. Thus, the device 103 can take the same advantage as the device 102 by using the same simple method of use as that of the device 101.

Figure 22:
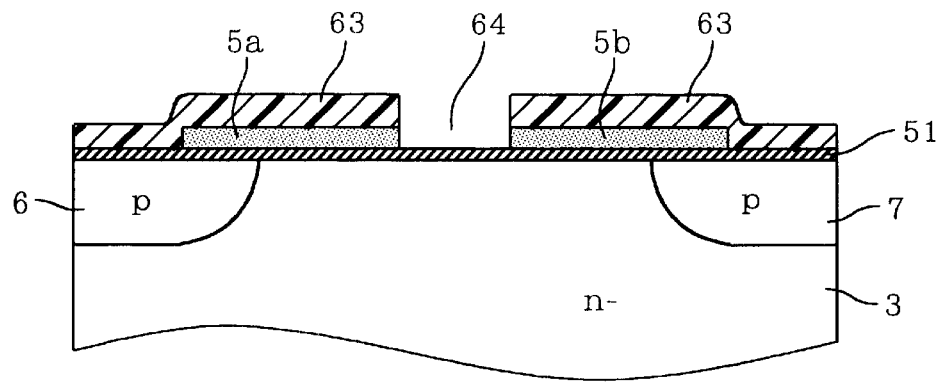
FIG. 22 is a view showing a manufacturing process of the device in accordance with the second preferred embodiment.

In order to manufacture the device 102 or the device 103, it is only necessary to perform a process step as shown in FIG. 22 between the steps of FIGS. 9 and 10 in the manufacturing method shown in the first preferred embodiment, for example. In the step of FIG. 22, first, a resist layer 63 patterned with a configuration of the gate electrodes 5a and 5b to be formed is formed on the exposed surface over the semiconductor base body 90. The resist layer 63 selectively has an opening 64 on a region where the gate electrodes 5a and 5b are separated from each other.

After that, the gate electrode S is selectively etched with the resist layer 63 used as a shield. As a result, the gate electrode S is selectively removed to form the gate electrodes 5a and 5b. The resist layer 63 is thereafter removed. Subsequently, the step of FIG. 10 and the following steps are performed. Thus, the devices 102 and 103 can be also easily manufactured by combining the ordinary wafer process like the device 101.

3. The Third Preferred Embodiment

Figure 23:
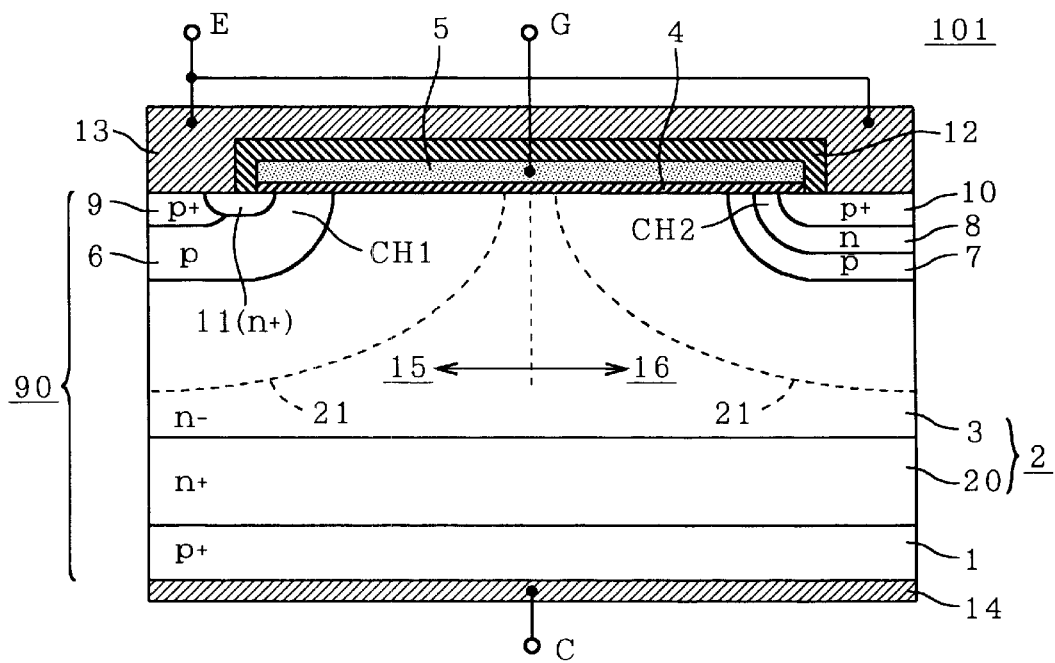
FIG. 23 is an illustration of operation of a device compared with a device in accordance with a third preferred embodiment.

FIG. 23 is a cross section showing a region where a depletion layer is generated in using the device 101 of the first preferred embodiment. When the device 101 is in the cut-off state, the depletion layer extends in the n⁻ layer 3 as indicated by drawing a boundary 21 with broken lines. To suppress the ON voltage low by setting the MOSFET region ratio a low, it becomes effective means to set the cell width Wcell long while keeping the width of the p base layer 6 (i.e., the base width Wp) constant.

When the cell width Wcell is set long, however, a spacing between the p base layers 6 and 7 is extended and the respective depletion layers accompanying the p base layers 6 and 7 are isolated from each other, not being coupled. As a result, since a bend appears in the boundary 21 of the depletion layer and the electric field concentrates on the portion, the breakdown voltage is degraded in some case. A device of the third preferred embodiment shown in the cross section of FIG. 24 has a structure to suppress degradation in the breakdown voltage due to the depletion layer. The whole plan view of the device 104 is the same as FIG. 2, and FIG. 24 corresponds to a cross section taken along the A—A sectional line of FIG. 2.

In this device 104, a p layer 22 (the eighth semiconductor layer) is selectively formed away from both the p base layers 6 and 7 in the surface to which the n⁻ layer 3 is exposed outside the p base layers 6 and 7 in the upper main surface of the semiconductor base body 90. The p layer 22 is formed to be shallower than the n⁻ layer 3 and not connected to the emitter electrode 13, unlike the p base layer 6. The p layer 22 is preferably formed to be equivalent in impurity concentration and depth to the p base layers 6 and 7. In this case, it becomes possible to form the p base layers 6 and 7 and the p layer 22 in a single process by using a single mask pattern.

Figure 24:
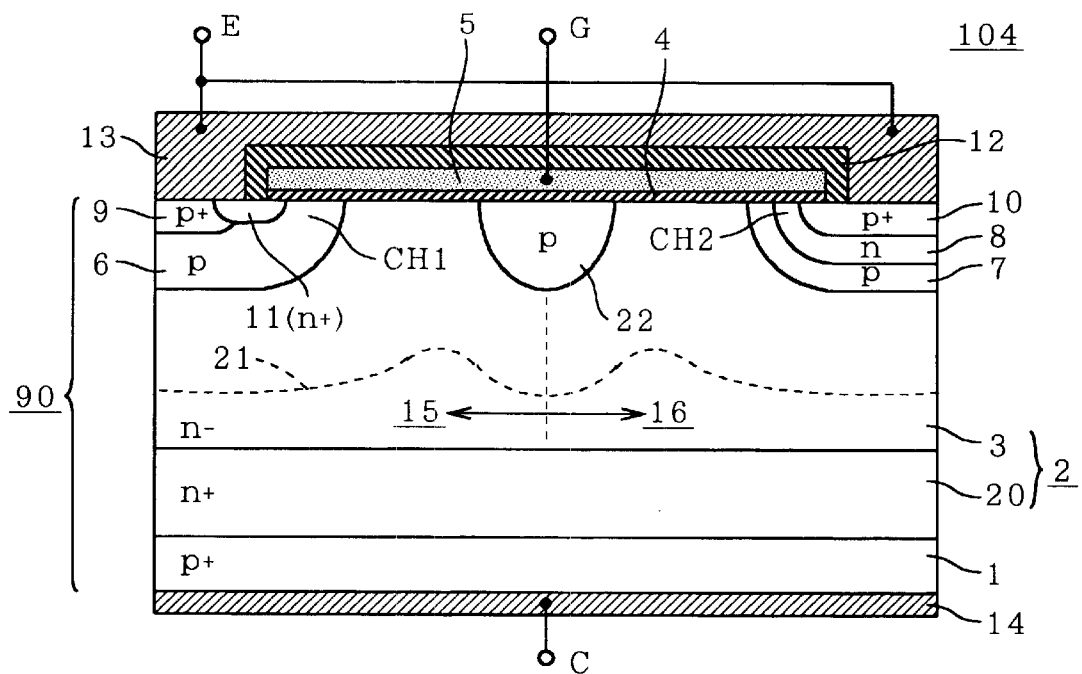
FIG. 24 is an illustration of operation of the device in accordance with the third preferred embodiment.

In the device 104, since the p layer 22 is provided, the respective depletion layers accompanying the p base layers 6 and 7 are coupled to each other in the cut-off state as shown in FIG. 24. As a result, since the boundary 21 of the depletion layer becomes relatively even, the breakdown voltage is enhanced.

Figure 25:
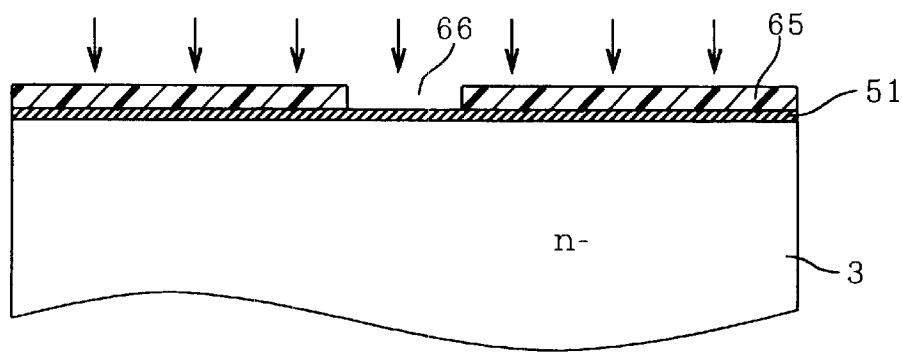
FIGS. 25 and 26 are views showing a manufacturing process of the device in accordance with the third preferred embodiment.
Figure 26:
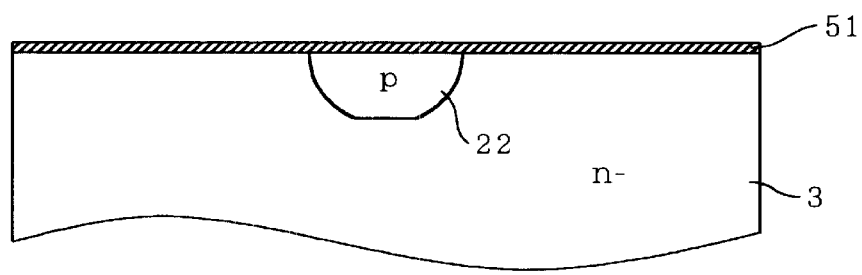

In order to manufacture the device 104, it is only necessary to perform process steps as shown in FIGS. 25 and 26 between the steps of FIGS. 6 and 7 in the manufacturing method shown in the first preferred embodiment, for example. In the step of FIG. 25, first, the insulating film 51 which is an original of the gate insulating film 4 is formed on the upper main surface of the semiconductor base body 90. After that, a resist layer 65 which selectively has an opening 66 at a portion corresponding to the p layer 22, i.e., the center portion in a region where the gate electrode 5 is to be formed is formed on the insulating film 51. Subsequently, a p-type impurity, e.g., boron is selectively implanted into the upper main surface of the semiconductor base body 90 with the resist layer 65 used as a shield.

Then, as shown in FIG. 26, after removing the resist layer 65, the diffusion of the impurity is performed. As a result, the p layer 22 is selectively formed in a form corresponding to the opening 66 in the upper main surface of semiconductor base body 90. The p layer 22 is formed to be shallower than the n⁻ layer 3. After that, the step of FIG. 7 and the following steps are performed. Since the insulating film 51 has been already formed before the step of FIG. 7, the step of forming the insulating film 51 is omitted in the step of FIG. 7. Thus, the device 104 can be also easily manufactured by combining the ordinary wafer process like the device 101.

4. The Fourth Preferred Embodiment

Figure 27:
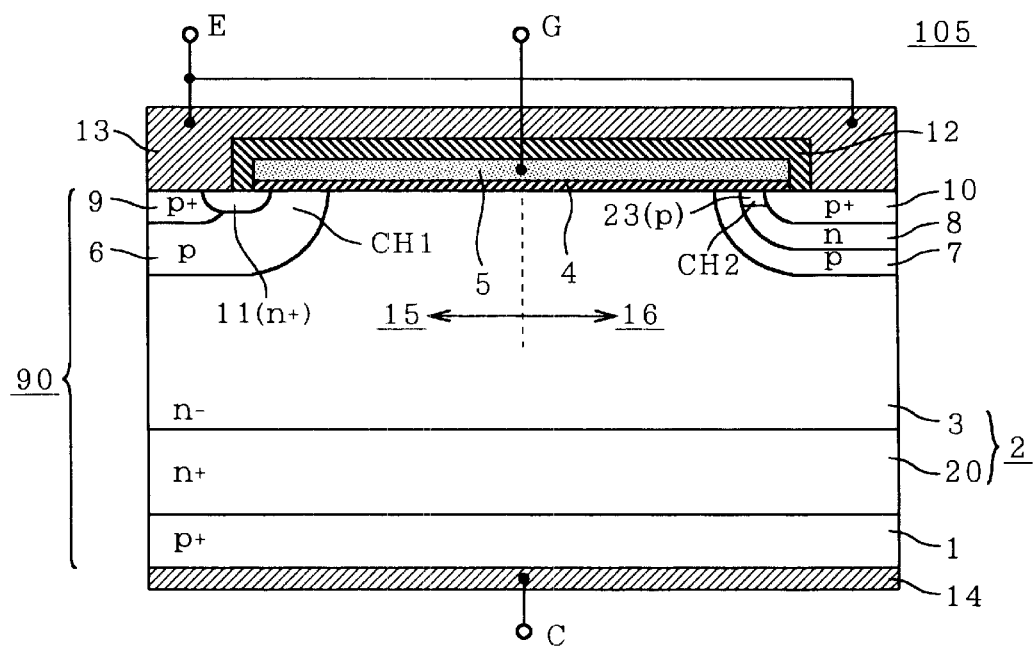
FIG. 27 is a cross-sectional elevation of a device in accordance with a fourth preferred embodiment.

FIG. 27 is a cross section of a semiconductor device in accordance with the fourth preferred embodiment. The whole plan view of this device 105 is the same as FIG. 2, and FIG. 27 corresponds to a cross section taken along the A—A sectional line of FIG. 2. The device 105 is characteristically different from the device 101 in that a p layer 23 (the eighth semiconductor layer) is formed in the channel region CH2, i.e., a region in which the n layer 8 is so exposed to the upper main surface of the semiconductor base body 90 as to be opposed to the gate electrode 5. The p layer 23 can be formed by selectively implanting and diffusing the p-type impurity in a region corresponding to the p layer 23 in any one stage in a series of process steps shown in the first preferred embodiment.

In the device 105, since the channel region CH2 has a p-type conductivity type, the channel region CH2, i.e., the p layer 23 is inverted to n type when the gate voltage higher than the positive gate threshold voltage $V_{th2}$ inherent to the channel region CH2 is applied to the gate electrode 5, like in the channel region CH1. In other words, the p layer 23 seems as if to be equivalent to the p base layer 7. As a result, like in the device 101 not having the p layer 23, the p base layer 7 and the p⁺ layer 10 are insulated by the n layer 8.

Figure 28:
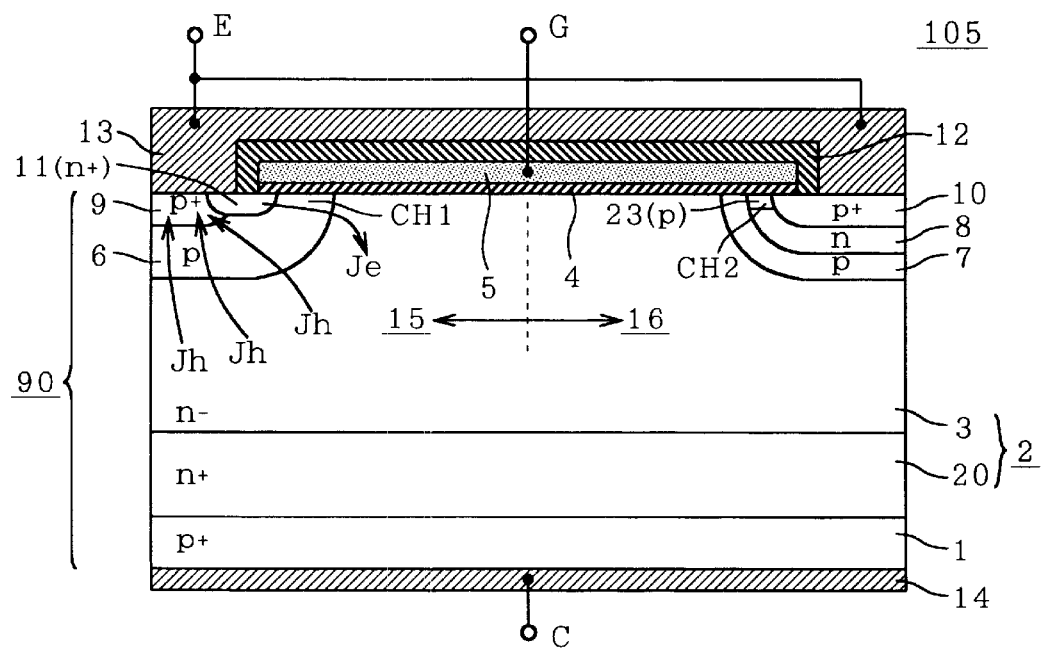
FIGS. 28 and 29 are views showing an operation of the device in accordance with the fourth preferred embodiment.

Therefore, in order to bring the device 105 into conduction, it is only necessary to apply a voltage higher than both the gate threshold voltage $V_{th1}$ of the channel region CH1 and the gate threshold voltage $V_{th2}$ of the channel region CH2 as the gate voltage. That restricts the path of the hole current Jh only to the p base layer 6 as shown in FIG. 28, and it becomes possible to enhance the hole accumulation effect, like in the device 101.

At this time, since it is necessary to invert the whole p layer 23 into n layer, the depth of the p layer 23 is set so that the whole p layer 23 can be inverted at the gate voltage of recommended value to bring the device 105 into conduction. The p layer 23 is formed to be shallower than at least the n layer 8.

Figure 29:
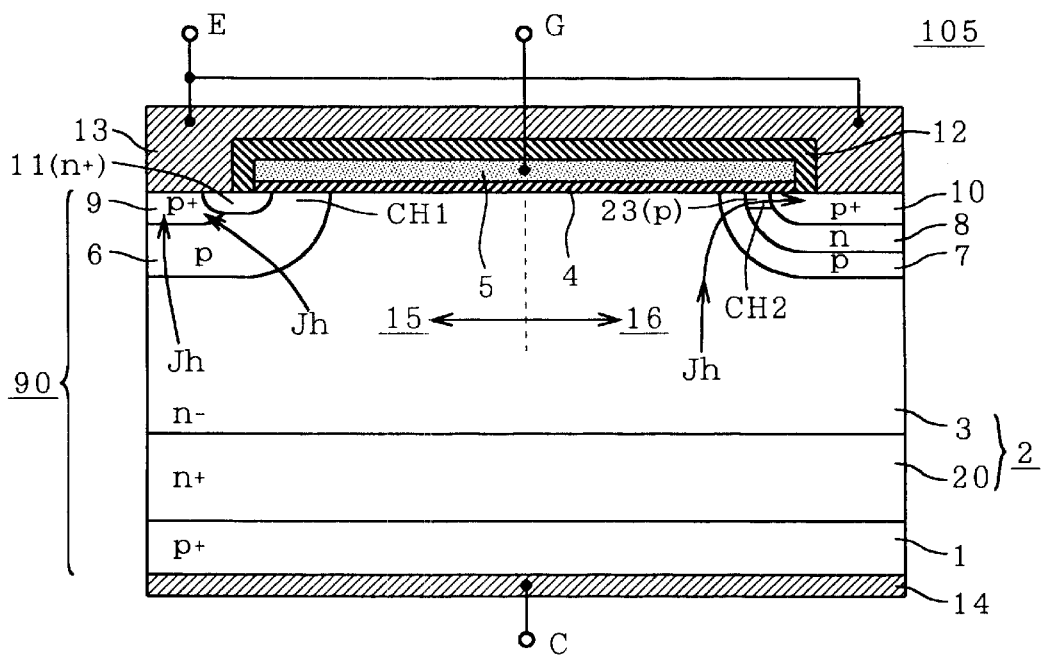

On the other hand, when a voltage lower than the positive gate threshold voltage $V_{th2}$, e.g., zero voltage is applied as the gate voltage, the channel region CH2, i.e., the p layer 23 is returned to the natural p type. As a result, the p base layer 7 is electrically connected to the emitter electrode 13 through the p layer 23 and the p⁺ layer 10. Therefore, to turn off the device 105, it is only necessary to apply, e.g., zero voltage as the gate voltage. That makes the hole current Jh flow to the emitter electrode 13 both through the p base layers 6 and 7, like when the negative voltage is applied to the gate electrode 5 in the device 101, as shown in FIG. 29.

Thus, in the device 105, since it is not necessary to apply the negative voltage as the gate voltage, an advantage of more convenience in use is obtained in ensuring reduction in the ON voltage without narrowing the operating area.

5. The Fifth Preferred Embodiment

Figure 30:
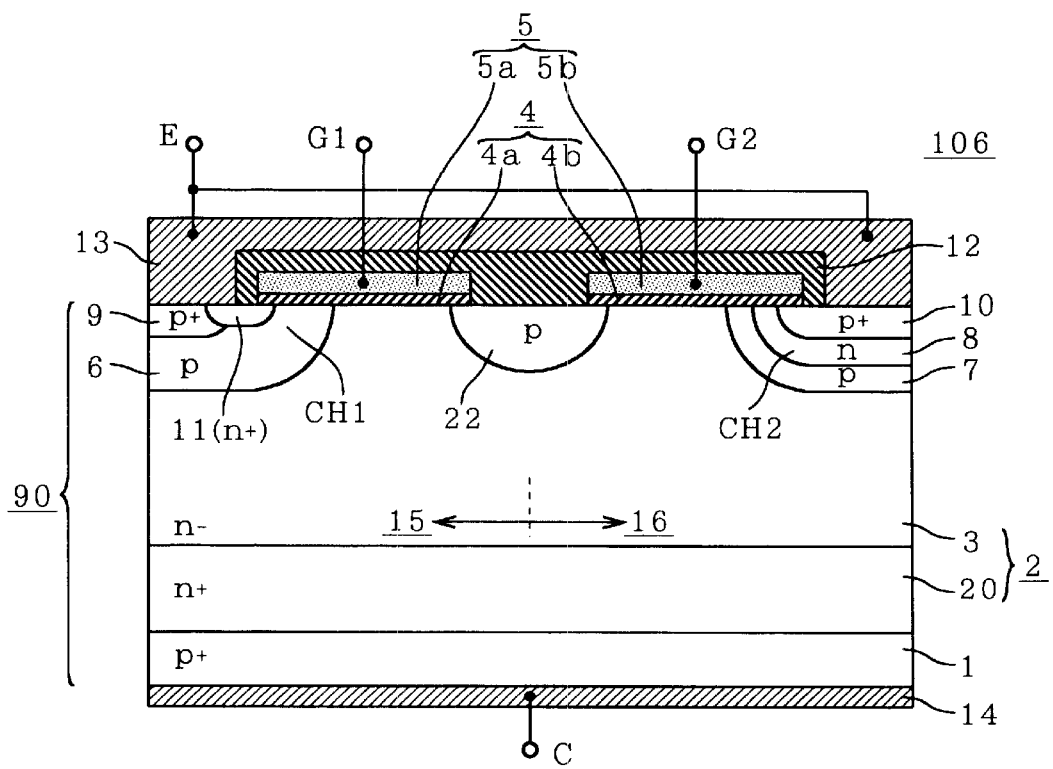
FIG. 30 is a cross-sectional elevation of a device in accordance with a fifth preferred embodiment.

FIG. 30 is a cross section of a semiconductor device in accordance with the fifth preferred embodiment. In this device 106, the gate electrode 5 is separated into the gate electrodes 5a and 5b, like in the devices 102 and 103. Further, like in the device 104, the p layer 22 is selectively formed away from both the p base layers 6 and 7 in the surface to which the n⁻ layer 3 is exposed outside the p base layers 6 and 7 in the upper main surface of the semiconductor base body 90. The characteristic feature of the device 106 lies in that the p layer 22 is so formed as to cover a region immediately below a gap between the gate electrodes 5a and 5b in the upper main surface of the semiconductor base body 90.

When the gate electrode 5 is separated into the gate electrodes 5a and 5b and there is a gap therebetween, the potential gradient along the exposed surface of the n⁻ layer 3 positioned immediately below the gap is likely to be uneven. In the device 106, however, since the p layer 22 is so formed as to cover the gap, the electric field concentration can be suppressed. Specifically, the electric field concentration resulting from the separate arrangement of the gate electrode 5 can be relieved as well as the boundary 21 of the depletion layer (FIG. 24) is made even by providing the p layer 22. Further, through the double mechanisms, the breakdown voltage can be enhanced.

Figure 31:
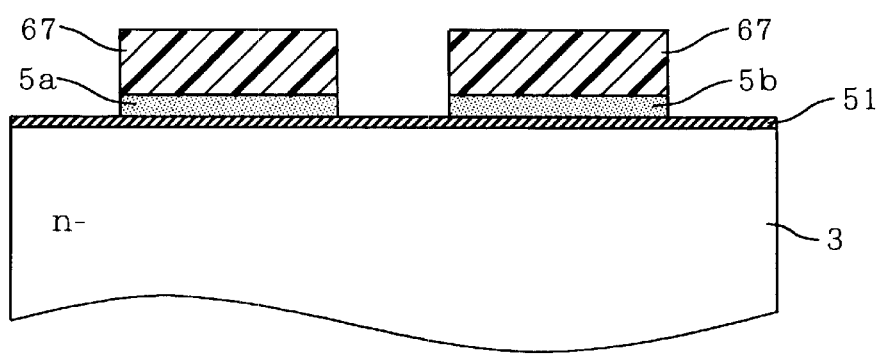
FIGS. 31 and 32 are views showing a manufacturing process of the device in accordance with the fifth preferred embodiment.
Figure 32:
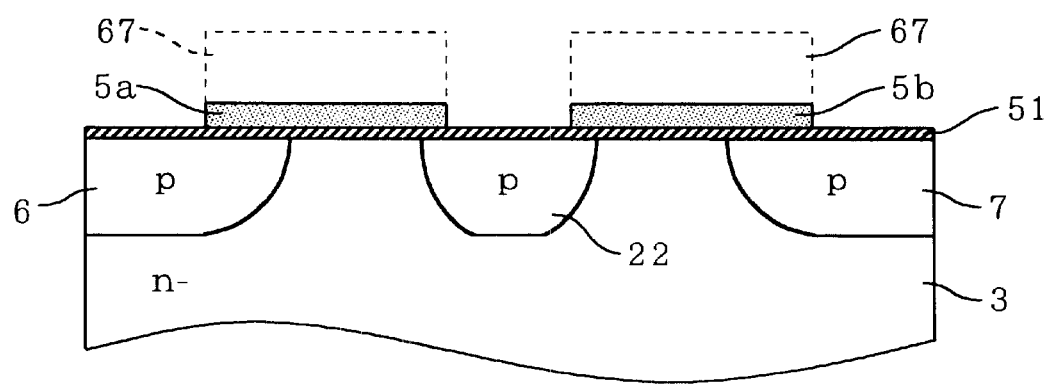

In order to manufacture the device 106, it is only necessary to perform process steps as shown in FIGS. 31 and 32 instead of the steps of FIGS. 8 and 9 in the manufacturing method shown in the first preferred embodiment, for example. In the step of FIG. 31, first, a resist layer 67 patterned with a configuration of the gate electrodes 5a and 5b to be formed is formed over the insulating film 51. After that, the conductive material 52 is selectively etched with the resist layer 67 used as a shield. As a result, the conductive material 52 is selectively removed to form the gate electrodes 5a and 5b.

In the next step of FIG. 9, first, a p-type impurity, e.g., boron is selectively implanted in the upper main surface of the semiconductor base body 90 with the resist layer 67 and the gate electrodes 5a and 5b used as shields. Then, after removing the resist layer 67, the diffusion of the impurity is performed. As a result, the p base layers 6 and 7 and the p layer 22 are selectively formed away from one another in the surface in which the n⁻ layer 3 is exposed in the upper main surface of the semiconductor base body 90.

The p base layers 6 and 7 enter the portion immediately below the gate electrodes 5a and 5b, respectively, in the upper main surface of the semiconductor base body 90 to some degree. Further, the p layer 23 also enters the portion immediately below the gate electrodes 5a and 5b, to some degree. After that, the step of FIG. 10 and the following steps are performed. Thus, it is possible to form the p base layers 6 and 7 and the p layer 22 in the common process at the same time.

6. The Sixth Preferred Embodiment

Figure 33:
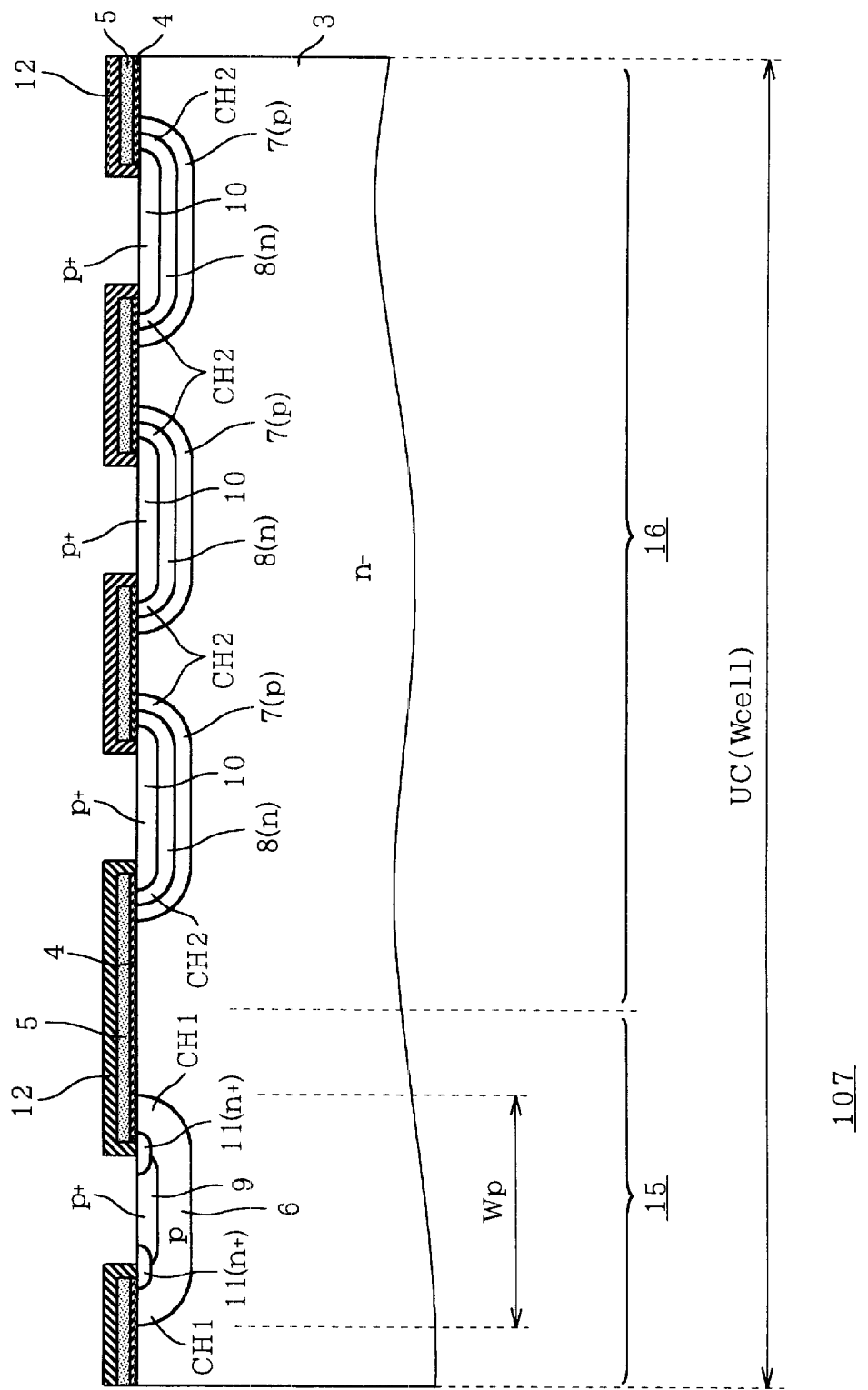
FIG. 33 is a cross-sectional elevation of a device in accordance with a sixth preferred embodiment.

FIG. 33 is a cross section of a semiconductor device in accordance with the sixth preferred embodiment, showing a structure near the upper main surface of the semiconductor base body 90 over the whole unit cell. As is clear from comparison with FIG. 3, this device 107 comprises a single p base layer 6 belonging to the first MOS region 15 and a plurality of p base layers 7 (three in FIG. 33) belonging to the second MOS region 16 in a single unit cell UC. The inner structure of the p base layers 7 and the relation to the gate electrode 5 and the emitter electrode 13 are equivalent to those in the p base layer 7 of FIG. 3.

In other words, one multilayer structure having the p base layer 7, the n layer 8 and the p⁺ layer 10 exists in a single unit cell UC in the device of FIG. 3 while one multilayer structure is divided into three unit multilayer structures in a single unit cell UC in the device of FIG. 33. Similarly, assuming that portions of the gate electrode 5 positioned over the first and second MOS regions 15 and 16 are referred to as a first gate electrode and a second gate electrode, respectively, and portions of the gate insulating film 4 positioned above the first and second MOS regions 15 and 16 are referred to as a first insulating film and a second insulating film, respectively, it is represented that the second gate electrode and the second insulating film are divided into three unit second gate electrodes and three unit second insulating films, respectively, in the device of FIG. 33. Further, the positional relation among each unit multilayer structure, each unit second gate electrode and each unit second insulating film is equivalent to that among the multilayer structure, the second gate electrode and the second insulating film in FIG. 3.

As discussed earlier, to suppress the ON voltage low by setting the MOSFET region ratio α low, it becomes effective means to set the cell width Wcell long while keeping the width of the p base layer 6 constant. At this time, by increasing the number of p base layers 7 with the increase in cell width Wcell, it is possible to increase the number of channel regions CH2 in one unit cell UC.

The ratio of the hole current Jh flowing during the turn-off bypassed in the p base layer 7 is thereby increased and the density of the hole current Jh in the p base layer 6 can be relieved. As a result, the withstand turn-off voltage is further enhanced and a still wider operating area is ensured. Thus, in the device 107, since a plurality of p base layers 7 belonging to the second MOS region 16 are provided in a single unit cell UC, it is possible to further reduce the ON voltage while ensuring a wide operating area. Further, the device 107 can be easily manufactured by changing the number of p base layers 7, n layers 8 and so on formed in a single unit cell UC so as to be consistent with FIG. 33 in the manufacturing method of the first preferred embodiment.

7. The Seventh Preferred Embodiment

Figure 34:
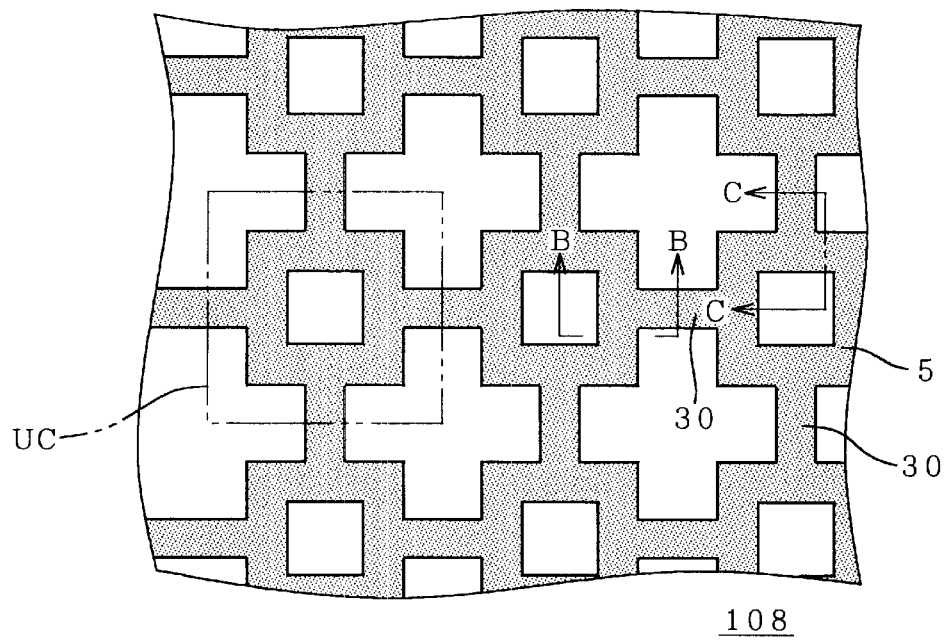
FIG. 34 is a cross-sectional plan view of a device in accordance with a seventh preferred embodiment.

FIG. 34 is a fragmentary plan view of a semiconductor device in accordance with the seventh preferred embodiment. In this device 108, the unit cells UC are arranged in matrix, not in stripes, along the main surface of the semiconductor base body 90. The gate electrodes 5 belonging to the unit cells UC are connected to one another through crosslink portions 30. The crosslink portion 30 is contiguously coupled with the gate electrode 5 and can be formed at the same time in the step of forming the gate electrode 5. The whole plan view of the device 108 is the same as, e.g., FIG. 2 and the gate electrode 5 or the crosslink portion 30 in the unit cell UC nearest to a gate line GL is connected to the gate line GL.

Both the cross sections taken along the B—B and C—C sectional lines of FIG. 34 are represented equivalently to FIG. 1. Therefore, in the device 108, the second MOS region 16 is so arranged as to annularly surround the first MOS region 15 along the main surface of the semiconductor base body 90 in a single unit cell UC. In other words, in a single unit cell UC, the p base layer 6 is formed in a form of isolated island and the p base layer 7 is so formed as to annularly surround the p base layer 6.

For this reason, since it is easy to set the MOSFET region ratio α low and the channel region CH2 is so arranged as to surround the p base layer 6, the ratio of the hole current Jh flowing during the turn-off bypassed in the p base layer 7 is thereby increased and the density of the hole current Jh in the p base layer 6 can be relieved. As a result, the withstand turn-off voltage is further enhanced and a still wider operating area is ensured. Thus, in the device 108, since the second MOS region 16 is so arranged as to annularly surround the inland-shaped first MOS region 15 in a single unit cell UC, it is possible to further reduce the ON voltage while ensuring a wide operating area.

Since the sectional structures of the device 108 taken along the B—B and C—C sectional lines are equivalent to the sectional structure taken along the A—A sectional line of the device 101 (FIG. 2), the device 108 can be manufactured by using the manufacturing method discussed in the first preferred embodiment. In this case, it is only necessary to so form the gate electrode 5 as to be annular as shown in FIG. 34 in the step of FIG. 8.

Figure 35:
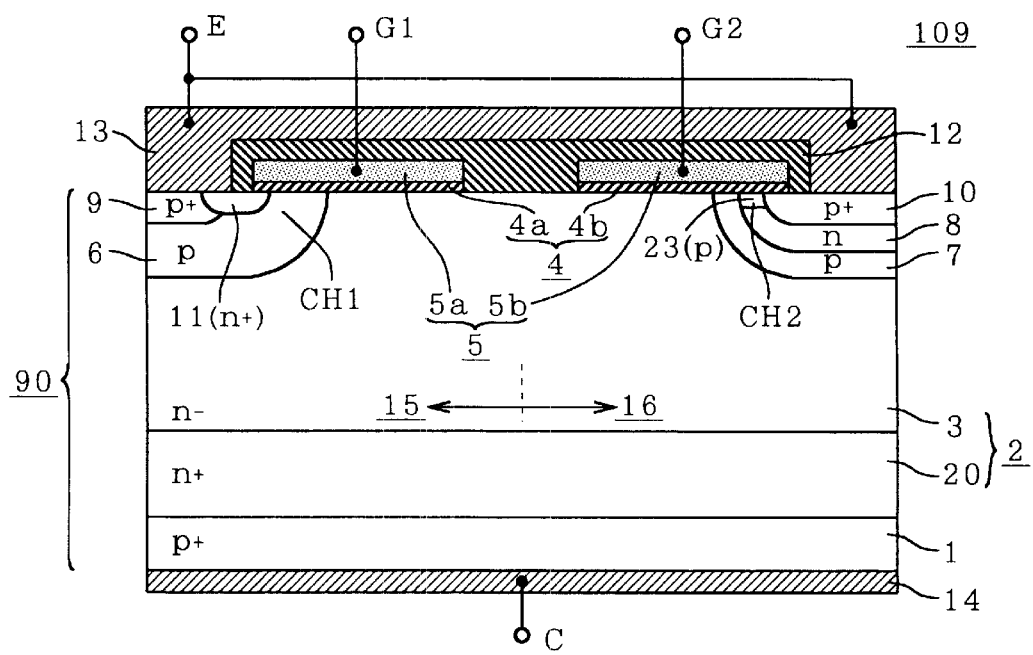
FIG. 35 is a cross-sectional elevation of a device in accordance with a variation.

8. Variation (1) It is possible to combine the above-discussed preferred embodiments. For example, as shown in the cross section of FIG. 35, it is possible to provide a device having a structure with both characteristic features of the device 102 of the second preferred embodiment and the device 105 of the fourth preferred embodiment. In this device 109, the gate electrode 5 is divided into the gate electrodes 5a and 5b and the p layer 23 is provided. The device 109 thereby obtains both advantages of the device 102 and the device 105. Further, the device 109 can be easily manufactured by combining the manufacturing process of the device 102 and the device 105.

Figure 36:
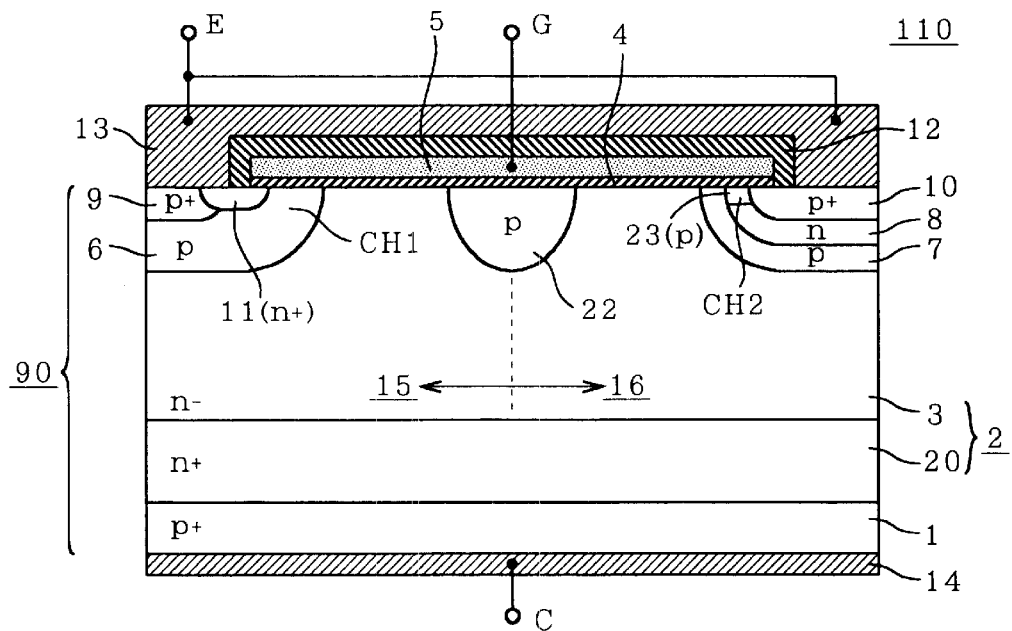
FIG. 36 is a cross-sectional elevation of a device in accordance with another variation.

Further, as shown in the cross section of FIG. 36, it is possible to provide a device having a structure with both characteristic features of the device 104 of the third preferred embodiment and the device 105 of the fourth preferred embodiment. This device 110 comprises both the p layer 22 and the p layer 23. The device 110 thereby obtains both advantages of the device 104 and the device 105. Further, the device 110 can be easily manufactured by combining the manufacturing processes of the device 104 and the device 105. It is possible to make various combinations, not limited to the above examples.

Figure 37:
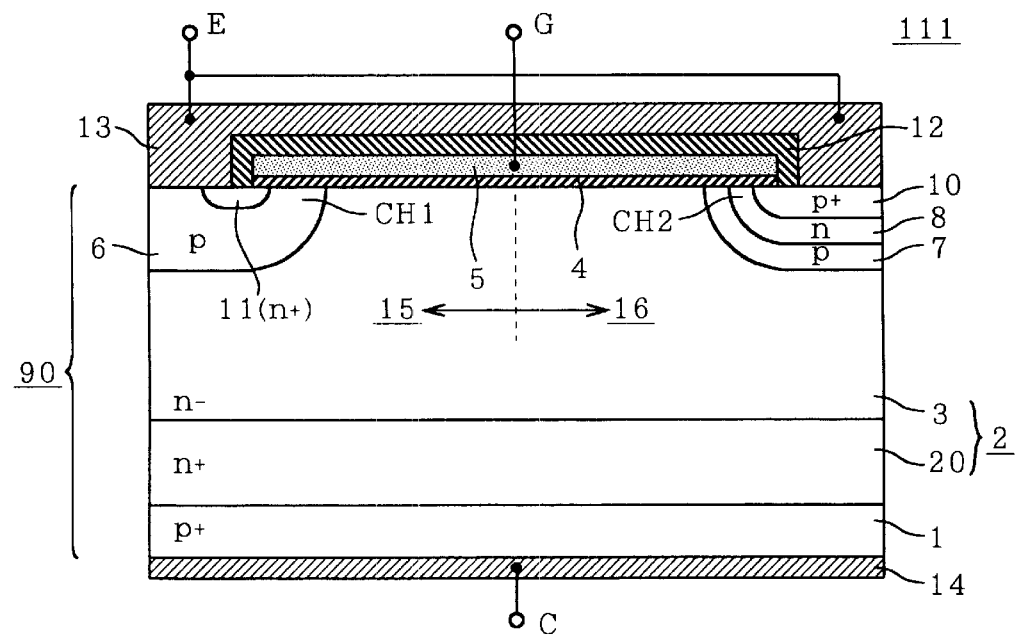
FIG. 37 is a cross-sectional elevation of a device in accordance with still another variation.

(2) In the devices of the above-discussed preferred embodiments, the p$^+$ layer 9 is provided and the p base layer 6 is connected to the emitter electrode 13 through the p+layer 9 of low resistance. This enhances the withstand latch-up voltage. If the device does not need high withstand latch-up voltage, however, the p$^+$ layer 9 may be omitted as shown in the cross section of FIG. 37. In this device 111, no p$^+$ layer 9 is provided and the p base layer 6 is connected directly to the emitter electrode 13. Further, it is possible to set the impurity concentration of the p$^+$ layer 10 almost equal to that of the p base layer 7.

Figure 38:
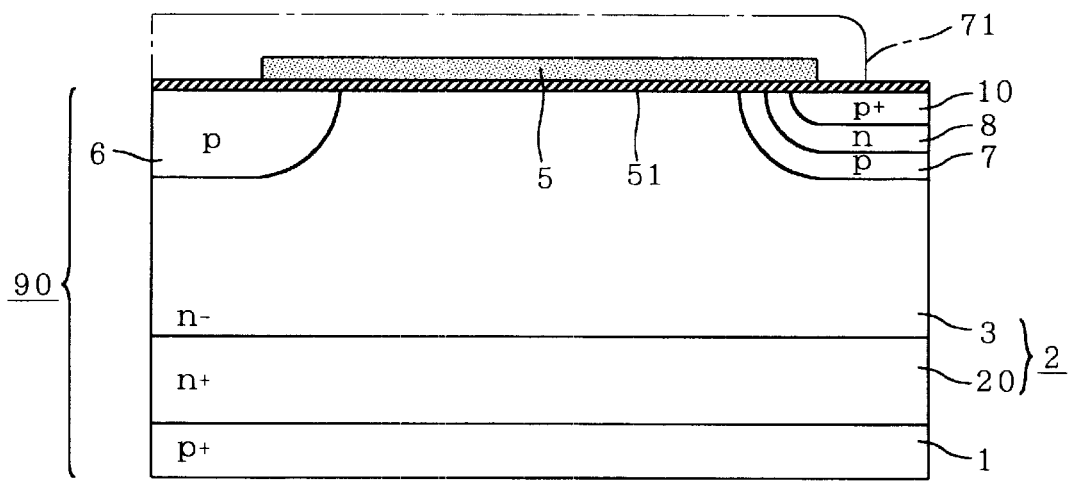
FIG. 38 is a view showing a manufacturing process of the device of FIG. 37.

In order to manufacture the device 111, it is only necessary to perform the step of FIG. 38 instead of the step of FIG. 12 in the manufacturing method shown in the first preferred embodiment, for example. In the step of FIG. 38, first, a resist layer 71 is so formed as to selectively cover the upper surface and the side surface of the gate electrode 5 and a portion of the insulating film 51 positioned on the p base layer 6. Specifically, the resist layer 71 selectively has an opening over a region inside the portion to which the n layer 8 is exposed in the upper main surface of the semiconductor base body 90.

Next, a p-type impurity, e.g., boron is implanted in high concentration in the upper main surface of the semiconductor base body 90 with the resist layer 71 used as a shield. Then, after removing the resist layer 71, the diffusion of the impurity is performed. As a result, the p$^+$ layer 10 is selectively formed in the surface to which the n layer 8 is exposed. The p$^+$ layer 10 is formed to be shallower than the n layer 8 and inside the n layer 8. Further, the p$^+$ layer 10 is formed so that its edge may be positioned at the edge of or inside the portion immediately below the gate electrode 5 in the upper main surface of the semiconductor base body 90, like in the step of FIG. 12. The step of FIG. 13 and the following steps are thereafter performed.

Figure 39:
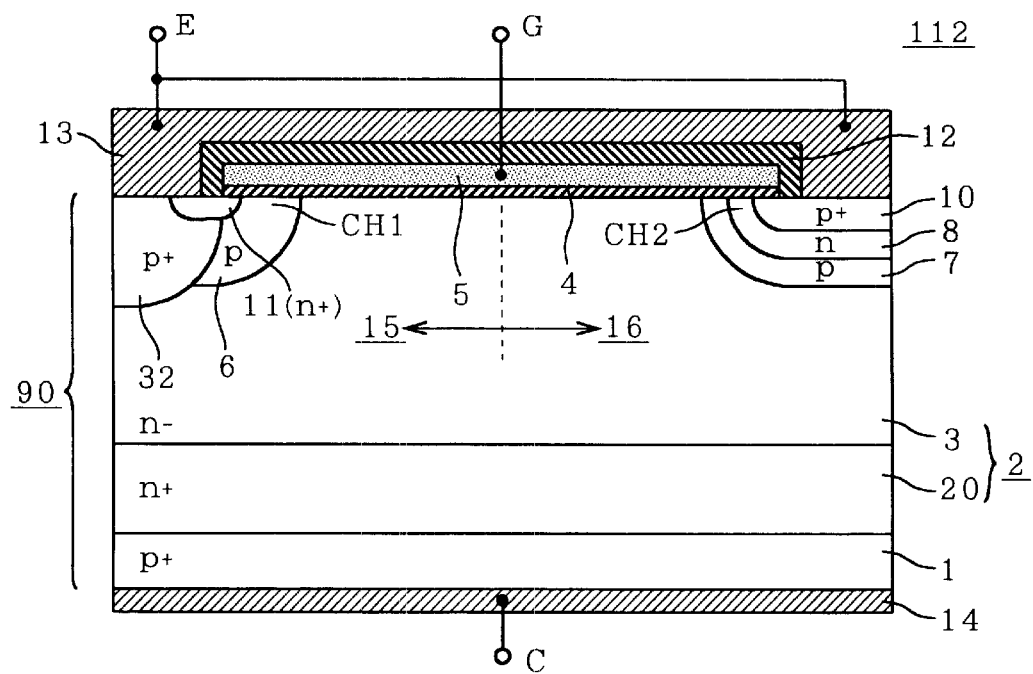
FIG. 39 is a cross-sectional elevation of a device in accordance with yet another variation.

(3) In the devices of the above-discussed preferred embodiments, the p$^+$ layer 9 is formed to be shallower than the p base layer 6 and inside the p base layer 6. The p$^+$ layer 9, however, may be formed to be deeper than the p base layer 6 and extend off a lower portion of the p base layer 6. FIG. 39 is a cross section showing an example of this structure. This device 112 comprises a p$^+$ layer 32 deeper than the p base layer 6, instead of the p$^+$ layer 9.

Further, the p$^+$ layer 32 is so formed as to avoid the channel region CH1. Specifically, a configuration that an edge of the p$^+$ layer 32 along the upper main surface of the semiconductor base body 90 is positioned in a surface to which the n$^+$ emitter layer 11 is exposed is not different from that as to the p$^+$ layer 9 in the device 101 the like. It is thereby possible to prevent the gate threshold voltage $V_{th1}$ of the channel region CH1 from being affected by the p$^+$ layer 32. In the device 112, since the p$^+$ layer 32 is formed to be deeper than the p base layer 6, the voltage drop caused by the passage of the hole current Jh can be suppressed still lower. Therefore, an advantage of further enhancing the withstand latch-up voltage can be obtained.

Figure 40:
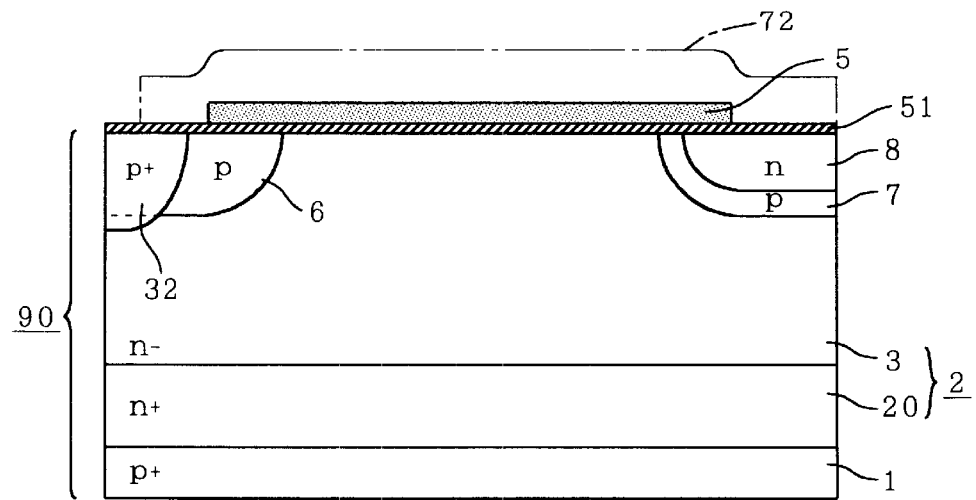
FIG. 40 is a view showing a manufacturing process of the device of FIG. 39.

In order to manufacture the device 112, it is only necessary to perform the step of FIG. 40 instead of the step of FIG. 12 in the manufacturing method shown in the first preferred embodiment, for example. In the step of FIG. 40, first, a resist layer 72 is so formed as to selectively cover the upper surface and the side surface of the gate electrode 5 and the portion of the insulating film 51 positioned on the n layer 8. Specifically, the resist layer 71 selectively has an opening over the region inside the portion to which the p base layer 6 is exposed in the upper main surface of the semiconductor base body 90.

Next, a p-type impurity, e.g., boron is implanted in high concentration in the upper main surface of the semiconductor base body 90 with the resist layer 72 used as a shield. Then, after removing the resist layer 72, the diffusion of the impurity is performed. As a result, the p$^+$ layer 32 is selectively formed to the surface in which the p base layer 6 is exposed in the upper main surface of the semiconductor base body 90. The p$^+$ layer 32 is formed to be shallower than the p base layer 6 and inside the p base layer 6. After that, following the step of FIG. 38, the step of FIG. 13 and the following steps discussed in the first preferred embodiment are performed.

In the step of FIG. 40, though the edge of the p$^+$ layer 32 may be positioned immediately below the gate electrode 5, after the step of FIG. 13, one edge of the n$^+$ emitter layer 11 is positioned so that all the surfaces in the portion immediately below the gate electrode 5 in the upper main surface to which the p$^+$ layer 9 is exposed may be replaced with the n$^+$ emitter layer 11 and the p$^+$ layer 9 may not be exposed. At the same time, the other edge of the n$^+$ emitter layer 11 is positioned so that the n$^+$ emitter layer 11 and the p$^+$ layer 32 may be exposed to a portion outside the portion immediately below the gate electrode 5 in the upper main surface and the p base layer 6 may not be exposed.

(4) In the above-discussed preferred embodiments, an IGBT in which the channel region CH1 is an n channel, i.e., an n channel-type IGBT is taken as an example. It is possible, however, to obtain a p channel-type IGBT by inverting the conductivity type of the semiconductor layers provided in the devices. Also in the p channel-type IGBT, the same effects as in the above-discussed preferred embodiments can be produced.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a semiconductor base body defining an upper main surface and a lower main surface,
   wherein said semiconductor base body comprises
      a first semiconductor layer of a first conductivity type exposed to said lower main surface;
      a second semiconductor layer of a second conductivity type formed on said first semiconductor layer and exposed to said upper main surface;

a third semiconductor layer of the first conductivity type selectively formed in said upper main surface, being shallower than said second semiconductor layer;

a fourth semiconductor layer of the second conductivity type selectively formed in a surface to which said third semiconductor layer is exposed, being shallower than said third semiconductor layer and inside said third semiconductor layer;

a fifth semiconductor layer of the first conductivity type selectively formed in said upper main surface, being shallower than said second semiconductor layer and away from said third semiconductor layer;

a sixth semiconductor layer of the second conductivity type selectively formed in a surface to which said fifth semiconductor layer is exposed, being shallower than said fifth semiconductor layer and inside said fifth semiconductor layer; and a seventh semiconductor layer of the first conductivity type selectively formed in a surface to which said sixth semiconductor layer is exposed, being shallower than said sixth semiconductor layer and inside said sixth semiconductor layer, wherein a surface to which said third semiconductor layer is exposed in said upper surface includes a first region and a second region separated by said fourth semiconductor layer, and at least said second region of them is sandwiched by a surface to which said fourth semiconductor layer is exposed and a surface to which said second semiconductor layer is exposed, said device further comprising:

a first gate electrode opposed to said second region with a first insulating film sandwiched therebetween;

a second gate electrode opposed to a surface to which said sixth semiconductor layer is exposed in said upper surface with a second insulating film sandwiched therebetween;

a first main electrode connected to said first region, said fourth semiconductor layer and said seventh semiconductor layer; and a second main electrode connected to sa id lower main surface, and wherein a transistor including said second semiconductor layer, said fifth semiconductor layer and said sixth semiconductor layer does not operate even when a predetermined voltage is applied to said second gate electrode and said first main electrode, respectively.

2. The semiconductor device according to claim 1, wherein said first gate electrode and said second gate electrode are electrically connected to each other.

3. The semiconductor device according to claim 2, wherein said first insulating film and said second insulating film are contiguously coupled to form a single insulating film, and said first gate electrode and said second gate electrode are contiguously coupled to form a single gate electrode, and a surface to which said second semiconductor layer is exposed with the same sandwiched between said third semiconductor layer and said seventh semiconductor layer in said upper main surface is covered with said single gate electrode with said single insulating film sandwiched therebetween.

4. The semiconductor device according to claim 2, wherein an area of said first gate electrode covering said upper main surface is larger that of said second gate electrode covering said upper main surface, and said first gate electrode and said second gate electrode are connected to each other at an end portion along said upper main surface.

5. The semiconductor device according to claim 1, wherein said first gate electrode and said second gate electrode are electrically insulated from each other.

6. The semiconductor device according to claim 1, wherein said semiconductor base body further comprises an eighth semiconductor layer of the first conductivity type formed in said surface to which said sixth semiconductor layer is exposed in said upper main surface.

7. The semiconductor device according to claim 1, wherein said semiconductor base body further comprises an eighth semiconductor layer of the first conductivity type selectively formed in an exposed surface which is a surface to which said second semiconductor layer is exposed in said upper main surface, being shallower than said second semiconductor layer and away from both said third and fifth semiconductor layers.

8. The semiconductor device according to claim 7, wherein said first insulating film and said first gate electrode are so extended as to also cover a portion adjacent to said third semiconductor layer in said exposed surface, and said second insulating film and said second gate electrode are so extended as to also cover a portion adjacent to said fifth semiconductor layer in said exposed surface, and a surface portion covered with neither said first gate electrode nor said second gate electrode exists in said exposed surface, and said eighth semiconductor layer is selectively formed in a region including said surface portion in said exposed surface.

9. The semiconductor device according to claim 8, wherein said third semiconductor layer, said fifth semiconductor layer and said eighth semiconductor layer are identical in depth and impurity concentration with one another.

10. The semiconductor device according to claim 1, wherein a multilayer structure including said fifth, sixth and seventh semiconductor layers is divided into a plurality of unit multilayer structures formed away from one another, said second insulating film and said second gate electrode comprise a plurality of unit second insulating films and a plurality of unit second gate electrodes, respectively, any one of said plurality of unit second gate electrodes is opposed to a surface to which a portion of said sixth semiconductor layer included in corresponding one of said plurality of unit multilayer structures is exposed in said upper main surface with corresponding one of said plurality of unit second insulating films sandwiched therebetween, and said first main electrode is connected to a portion of said seventh semiconductor layer included in each of said plurality of unit multilayer structures.

11. The semiconductor device according to claim 1, wherein
a multilayer structure including said fifth, sixth and seventh semiconductor layers is so annularly formed as to surround said third semiconductor layer.

12. The semiconductor device according to claim 1, wherein
said semiconductor base body further comprises an eighth semiconductor layer of the first conductivity type having an impurity concentration higher than that of said third semiconductor layer, selectively formed in a region inside edges of said third semiconductor layer in said upper main surface, being exposed to said first region and not exposed to said second region, and
said first main electrode is connected to said third semiconductor layer through said eighth semiconductor layer.

13. The semiconductor device according to claim 12, wherein
said seventh semiconductor layer and said eighth semiconductor layer are identical in depth and impurity concentration with each other.

14. The semiconductor device according to claim 1, wherein
said third semiconductor layer and said fifth semiconductor layer are identical in depth and impurity concentration with each other.

15. A semiconductor device, comprising:
a semiconductor base body defining an upper main surface and a lower main surface,
wherein said semiconductor base body comprises
 a first semiconductor layer of a first conductivity type exposed to said lower main surface;
 a second semiconductor layer of a second conductivity type formed on said first semiconductor layer and exposed to said upper main surface;
 a third semiconductor layer of the first conductivity type selectively formed in said upper main surface, being shallower than said second semiconductor layer;
 a fourth semiconductor layer of the second conductivity type selectively formed in a surface to which said third semiconductor layer is exposed, being shallower than said third semiconductor layer and inside said third semiconductor layer;
 a fifth semiconductor layer of the first conductivity type selectively formed in said upper main surface, being shallower than said second semiconductor layer and away from said third semiconductor layer;
 a sixth semiconductor layer of the second conductivity type selectively formed in a surface to which said fifth semiconductor layer is exposed, being shallower than said fifth semiconductor layer and inside said fifth semiconductor layer; and
 a seventh semiconductor layer of the first conductivity type selectively formed in a surface to which said sixth semiconductor layer is exposed, being shallower than said sixth semiconductor layer and inside said sixth semiconductor layer,
wherein a surface to which said third semiconductor layer is exposed in said upper surface includes a first region and a second region separated by said fourth semiconductor layer, and at least said second region of them is sandwiched by a surface to which said fourth semiconductor layer is exposed and a surface to which said second semiconductor layer is exposed,
said device further comprising:
 a first gate electrode opposed to said second region with a first insulating film sandwiched therebetween;
 a second gate electrode opposed to a surface to which said sixth semiconductor layer is exposed in said upper surface with a second insulating film sandwiched therebetween;
 a first main electrode connected to said first region, said fourth semiconductor layer and said seventh semiconductor layer; and
 a second main electrode connected to said lower main surface, and
wherein said sixth semiconductor layer and said first main electrode are not in contact with each other.

16. The semiconductor device according to claim 15, wherein said first gate electrode and said second gate electrode are electrically connected to each other.

17. The semiconductor device according to claim 16, wherein said first insulating film and said second insulating film are contiguously coupled to form a single insulating film, and said first gate electrode and said second gate electrode are contiguously coupled to form a single gate electrode, and
a surface to which said second semiconductor layer is exposed with the same sandwiched between said third semiconductor layer and said seventh semiconductor layer in said upper main surface is covered with said single gate electrode with said single insulating film sandwiched therebetween.

18. The semiconductor device according to claim 16, wherein
an area of said first gate electrode covering said upper main surface is larger that of said second gate electrode covering said upper main surface, and said first gate electrode and said second gate electrode are connected to each other at an end portion along said upper main surface.

19. The semiconductor device according to claim 15, wherein
said first gate electrode and said second gate electrode are electrically insulated from each other.

20. The semiconductor device according to claim 15, wherein
said semiconductor base body further comprises an eighth semiconductor layer of the first conductivity type formed in said surface to which said sixth semiconductor layer is exposed in said upper main surface.

21. The semiconductor device according to claim 15, wherein
said semiconductor base body further comprises an eighth semiconductor layer of the first conductivity type selectively formed in an exposed surface which is a surface to which said second semiconductor layer is exposed in said upper main surface, being shallower than said second semiconductor layer and away from both said third and fifth semiconductor layers.

22. The semiconductor device according to claim 21, wherein
said first insulating film and said first gate electrode are so extended as to also cover a portion adjacent to said third semiconductor layer in said exposed surface, and said second insulating film and said second gate electrode are so extended as to also cover a portion adjacent to said fifth semiconductor layer in said exposed surface, and a surface portion covered with neither said first gate electrode nor said second gate electrode exists in said exposed surface, and said eighth semiconductor layer is selectively formed in a region including said surface portion in said exposed surface.

23. The semiconductor device according to claim 22, wherein said third semiconductor layer, said fifth semiconductor layer and said eighth semiconductor layer are identical in depth and impurity concentration with one another.

24. The semiconductor device according to claim 15, wherein a multilayer structure including said fifth, sixth and seventh semiconductor layers is divided into a plurality of unit multilayer structures formed away from one another, said second insulating film and said second gate electrode comprise a plurality of unit second insulating films and a plurality of unit second gate electrodes, respectively, any one of said plurality of unit second gate electrodes is opposed to a surface to which a portion of said sixth semiconductor layer included in corresponding one of said plurality of unit multilayer structures is exposed in said upper main surface with corresponding one of said plurality of unit second insulating films sandwiched therebetween, and said first main electrode is connected to a portion of said seventh semiconductor layer included in each of said plurality of unit multilayer structures.

25. The semiconductor device according to claim 15, wherein a multilayer structure including said fifth, sixth and seventh semiconductor layers is so annularly formed as to surround said third semiconductor layer.

26. The semiconductor device according to claim 15, wherein said semiconductor base body further comprises an eighth semiconductor layer of the first conductivity type having an impurity concentration higher than that of said third semiconductor layer, selectively formed in a region inside edges of said third semiconductor layer in said upper main surface, being exposed to said first region and not exposed to said second region, and said first main electrode is connected to said third semiconductor layer through said eighth semiconductor layer.

27. The semiconductor device according to claim 26, wherein said seventh semiconductor layer and said eighth semiconductor layer are identical in depth and impurity concentration with each other.

28. The semiconductor device according to claim 15, wherein said third semiconductor layer and said fifth semiconductor layer are identical in depth and impurity concentration with each other.

* * * * *